United States Patent
Liu et al.

(10) Patent No.: US 10,419,261 B2
(45) Date of Patent: Sep. 17, 2019

(54) DECODING METHOD AND APPARATUS, AND SYSTEM THEREFOR

(71) Applicant: SHENZHEN SUPER DATA LINK TECHNOLOGY LTD., Shenzhen (CN)

(72) Inventors: Ruopeng Liu, Shenzhen (CN); Chunlin Ji, Shenzhen (CN); Shasha Zhang, Shenzhen (CN)

(73) Assignee: SHENZHEN SHEN ZHEN KUANG-CHI HEZHONG TECHNOLOGY LTD, Shenzhen (CN)

( * ) Notice: Subject to any disclaimer, the term of this patent is extended or adjusted under 35 U.S.C. 154(b) by 0 days.

(21) Appl. No.: 16/014,413

(22) Filed: Jun. 21, 2018

(65) Prior Publication Data
US 2018/0302261 A1    Oct. 18, 2018

Related U.S. Application Data

(63) Continuation of application No. PCT/CN2016/111404, filed on Dec. 22, 2016.

(30) Foreign Application Priority Data

Dec. 22, 2015 (CN) .......................... 2015 1 0969778
Dec. 22, 2015 (CN) .......................... 2015 1 0970071
(Continued)

(51) Int. Cl.
*H03M 13/25* (2006.01)
*H04L 27/26* (2006.01)
(Continued)

(52) U.S. Cl.
CPC ............ *H04L 27/2675* (2013.01); *H04L 1/00* (2013.01); *H04L 25/0202* (2013.01);
(Continued)

(58) Field of Classification Search
USPC .................................................. 375/341, 232
See application file for complete search history.

(56) References Cited

U.S. PATENT DOCUMENTS

| | | | | |
|---|---|---|---|---|
| 7,864,896 B2 * | 1/2011 | Hwang | ................ | H04B 7/0697 375/341 |
| 2007/0014385 A1 * | 1/2007 | Shiraishi | .......... | G11B 20/10009 375/341 |

(Continued)

FOREIGN PATENT DOCUMENTS

| CN | 101771644 A | 7/2010 |
|---|---|---|
| CN | 103346860 A | 10/2013 |

(Continued)

*Primary Examiner* — Eva Y Puente
(74) *Attorney, Agent, or Firm* — Cantor Colburn LLP

(57) ABSTRACT

A method includes: receiving a to-be-decoded symbol sequence, where the to-be-decoded symbol sequence includes N symbols; dividing the received to-be-decoded symbol sequence into a first symbol sequence and a second symbol sequence; calculating first distances between the first symbol sequence and each of corresponding $2^K$ ideal superimposed symbol sequences, and obtaining paths corresponding to relatively small distances based on the first distances; sequentially performing sequence detection on each symbol in the second symbol sequence based on the paths corresponding to the $2^{k-1}$ relatively small distances, calculating second distances between each symbol in the second symbol sequence and each ideal symbol sequence, and after the sequence detection is performed on a last symbol, obtaining an ideal symbol sequence corresponding to a minimum distance based on the second distances; and using the ideal symbol sequence corresponding to the minimum distance as an output symbol sequence.

18 Claims, 14 Drawing Sheets

(30) Foreign Application Priority Data

Dec. 22, 2015 (CN) .......................... 2015 1 0970075
Dec. 22, 2015 (CN) .......................... 2015 1 0970271

(51) Int. Cl.
*H04L 1/00* (2006.01)
*H04L 25/02* (2006.01)

(52) U.S. Cl.
CPC ...... *H04L 27/2602* (2013.01); *H04L 27/2657* (2013.01); *H04L 27/2671* (2013.01); *H03M 13/256* (2013.01)

(56) References Cited

U.S. PATENT DOCUMENTS

2010/0074319 A1* 3/2010 Tseng ................ H03M 13/1105
375/232
2017/0230207 A1* 8/2017 Holguin-Sanchez .......................
H04L 25/03

FOREIGN PATENT DOCUMENTS

CN 103856218 A 6/2014
WO 03019890 A1 3/2003

* cited by examiner

| Input symbols: | +1 | +1 | -1 | +1 | +1 | -1 | +1 | +1 | +1 | -1 | +1 |
|---|---|---|---|---|---|---|---|---|---|---|---|
| Superimposition procedure: | +1 | +1 | +1 | +1 | -1 | -1 | +1 | +1 | +1 | -1 | |
| | | +1 | -1 | +1 | -1 | +1 | +1 | +1 | -1 | | |
| + | | | | | | | +1 | +1 | -1 | | | |
| Output symbols: | +1 | +2 | +1 | +1 | -1 | +1 | +1 | +3 | +1 | +1 | +1 |

FIG. 5

2^K symbol permutations

| | $\tilde{a}_0$ | $\tilde{a}_1$ | $\tilde{a}_2$ |
|---|---|---|---|
| $msg_{sub1}$ | 1 | 1 | 1 |
| | 1 | 1 | -1 |
| | 1 | -1 | 1 |
| | 1 | -1 | -1 |
| $msg_{sub2}$ | -1 | 1 | 1 |
| | -1 | 1 | -1 |
| | -1 | -1 | 1 |
| | -1 | -1 | -1 |

Symbol superimposition

| | $\tilde{a}_0$ | $\tilde{a}_0 + \tilde{a}_1$ | $\tilde{a}_0 + \tilde{a}_1 + \tilde{a}_2$ |
|---|---|---|---|
| $M_{sub1}$ | 1 | 2 | 3 |
| | 1 | 2 | 1 |
| | 1 | 0 | 1 |
| | 1 | 0 | -1 |
| $M_{sub2}$ | -1 | 0 | 1 |
| | -1 | 0 | -1 |
| | -1 | -2 | -1 |
| | -1 | -2 | -3 |

FIG. 6

| Input symbols: | +1 | +1 | -1 | +1 | +1 | +1 | +1 | -1 | +1 | +1 |
|---|---|---|---|---|---|---|---|---|---|---|
| Superimposition procedure: | +1 | +1 | +1 | +1 | +1 | +1 | +1 | +1 | +1 | |
| | +1 | +1 | -1 | -1 | -1 | -1 | +1 | +1 | -1 | |
| | | | | +1 | -1 | +1 | -1 | +1 | +1 | -1 |
| Output symbols: | +1 | +2 | +1 | -1 | +1 | +1 | +3 | +1 | +1 | +1 |

FIG. 13

DECODING METHOD AND APPARATUS, AND SYSTEM THEREFOR

CROSS REFERENCE TO RELATED APPLICATIONS

This application is a continuation of PCT/CN2016/111404 filed on Dec. 22, 2016, which claims priority to Chinese patent application No. 201510969778.8 of Dec. 22, 2015; Chinese patent application No. 201510970075.7 of Dec. 22, 2015; Chinese patent application No. 201510970271.4 of Dec. 22, 2015; and Chinese patent application No. 201510970071.9 of Dec. 22, 2015, all of which are incorporated herein by reference.

TECHNICAL FIELD

The present invention relates to signal decoding in a wireless communications system, and in particular, to a decoding method and apparatus applied to an overlapped multiplexing system, and a system thereof.

BACKGROUND

An ideal expected objective of people for a wireless communications system is: A signal is transmitted in a channel in a distortionless manner, and effective information can be obtained at a receive end through efficient, fast, and fully correct decoding. In an actual system, because a real channel environment is relatively complex, some information is usually distorted in a signal transmission procedure. To obtain effective information through full decoding, a transmit end and a receive end need to use a relatively large transmit power and signal-to-noise ratio to transmit a signal, so that information can be correctly decoded at the receive end. However, the transmit power cannot be increased unlimitedly. Therefore, an efficient and correct decoding method needs to be found.

In the prior art, during sequence detection, a Hamming distance is used to select a best path at most time. However, the Hamming distance requires that hard decision processing first be performed on received data to convert the received data into a {0, 1} sequence, and then real data obtained after the decision be compared with ideal data to determine a quantity of same data. A sequence includes only 0 and 1. In an actual system, there is a relatively high probability that two-path data have a same Hamming distance. In addition, the data obtained after the hard decision has a certain error, making it difficult to accurately select the best path, thereby reducing a decoding success rate of the system.

SUMMARY

A technical issue to be resolved in the present invention is to provide a decoding method and apparatus, and a system thereof, so that a relatively high decoding success rate can be achieved under an equivalent condition.

Therefore, the present invention provides a decoding method and apparatus, and a system including the apparatus.

An aspect of the present invention provides a decoding method, including:
receiving a to-be-decoded symbol sequence, where the to-be-decoded symbol sequence includes N symbols;
dividing the received to-be-decoded symbol sequence into a first symbol sequence (1:K) and a second symbol sequence (K+1:N), where K is less than N;
calculating first distances between the first symbol sequence (1:K) and each of corresponding $2^K$ ideal superimposed symbol sequences, and obtaining paths corresponding to $2^{k-1}$ relatively small distances based on the first distances;
sequentially performing sequence detection on each symbol in the second symbol sequence (K+1:N) based on the paths corresponding to the $2^{k-1}$ relatively small distances, calculating second distances between each symbol in the second symbol sequence and each of the corresponding $2^K$ ideal symbol sequences, and after the sequence detection is performed on a last symbol, obtaining an ideal symbol sequence corresponding to a minimum distance based on the second distances; and
using the ideal symbol sequence corresponding to the minimum distance as an output symbol sequence.

Another aspect of the present invention provides a decoding apparatus, including:
a unit configured to receive a to-be-decoded symbol sequence, where the to-be-decoded symbol sequence includes N symbols;
a unit configured to divide the received to-be-decoded symbol sequence into a first symbol sequence (1:K) and a second symbol sequence (K+1:N), where K is less than N;
a unit configured to calculate first distances between the first symbol sequence (1:K) and each of corresponding $2^K$ ideal superimposed symbol sequences, and obtain paths corresponding to $2^{k-1}$ relatively small distances based on the first distances;
a unit configured to sequentially perform sequence detection on each symbol in the second symbol sequence (K+1:N) based on the paths corresponding to the $2^{k-1}$ relatively small distances, calculate second distances between each symbol in the second symbol sequence and each of the corresponding $2^K$ ideal symbol sequences, and after the sequence detection is performed on a last symbol, obtain an ideal symbol sequence corresponding to a minimum distance based on the second distances; and
a unit configured to use the ideal symbol sequence corresponding to the minimum distance as an output symbol sequence.

Another aspect of the present invention provides a decoding method, including: receiving a to-be-decoded symbol sequence, where the to-be-decoded symbol sequence includes N symbols;
generating $2^K$ ideal superimposed symbol sequences obtained after K ideal symbol sequences are superimposed, where K is less than N;
sequentially calculating first distances between a current symbol $y_i$ and each ideal superimposed symbol sequence, where i=K~N;
obtaining, based on the first distances, second distances obtained after accumulation of the current symbol;
after a last symbol $y_N$ is processed, obtaining an ideal symbol sequence corresponding to a minimum accumulated distance based on the second distances; and
using the ideal symbol sequence corresponding to the minimum accumulated distance as an output symbol sequence.

An aspect of the present invention provides a decoding apparatus, including:
a unit configured to receive a to-be-decoded symbol sequence, where the to-be-decoded symbol sequence includes N symbols;

a unit configured to generate $2^K$ ideal superimposed symbol sequences obtained after K ideal symbol sequences are superimposed, where K is less than N;

a unit configured to sequentially calculate first distances between a current symbol $y_i$ and each ideal superimposed symbol sequence, where i=K~N;

a unit configured to obtain, based on the first distances, second distances obtained after accumulation of the current symbol;

a unit configured to: after a last symbol $y_N$ is processed, obtain an ideal symbol sequence corresponding to a minimum accumulated distance based on the second distances; and a unit configured to use the ideal symbol sequence corresponding to the minimum accumulated distance as an output symbol sequence.

Generally, a length of to-be-decoded data is relatively large, and an accumulated distance increases as a decoding depth increases. If a system performs decoding output after all data is decoded, system resource consumption is relatively large. Therefore, a better processing method is used for a path storage capacity and distance storage. Usually, a path storage length of 4K-5K is selected. In this case, if a path memory is full but decoding decision output has not been performed, decision output may be performed forcibly, and the output is first performed for initial nodes having a same path. The accumulated distance increases as the decoding depth increases. In this case, the accumulated distance may be stored as a relative distance. In other words, a reference distance is defined, and a value of the reference distance varies depending on a system. In distance storage, a relative value of a second distance of each path relative to the reference distance is recorded. During selection of a best path, comparison is performed based on the relative distance.

BRIEF DESCRIPTION OF DRAWINGS

To make the objectives, features, and advantages of the present invention easier to understand, the following describes, in detail, specific implementations of the present invention with reference to the accompanying drawings.

FIG. 5 is an example diagram of a symbol superimposition procedure according to an embodiment of the present invention;

FIG. 6 is an example diagram of a permutation of the first K columns of symbols and symbol superimposition according to an embodiment of the present invention;

FIG. 13 is an input-output relationship tree diagram of a truncated OvTDM system according to an embodiment of the present invention;

DESCRIPTION OF EMBODIMENTS

The following further describes the present invention with reference to specific embodiments and accompanying drawings. The following descriptions illustrate more details to help fully understand the present invention. However, the present invention apparently can be implemented in a plurality of other manners different from the descriptions. A person skilled in the art may perform similar extension and derivation based on actual application circumstances without departing from connotations of the present invention. Therefore, content of the specific embodiments should not be constituted as a limitation to the protection scope of the present invention.

Figure 1:
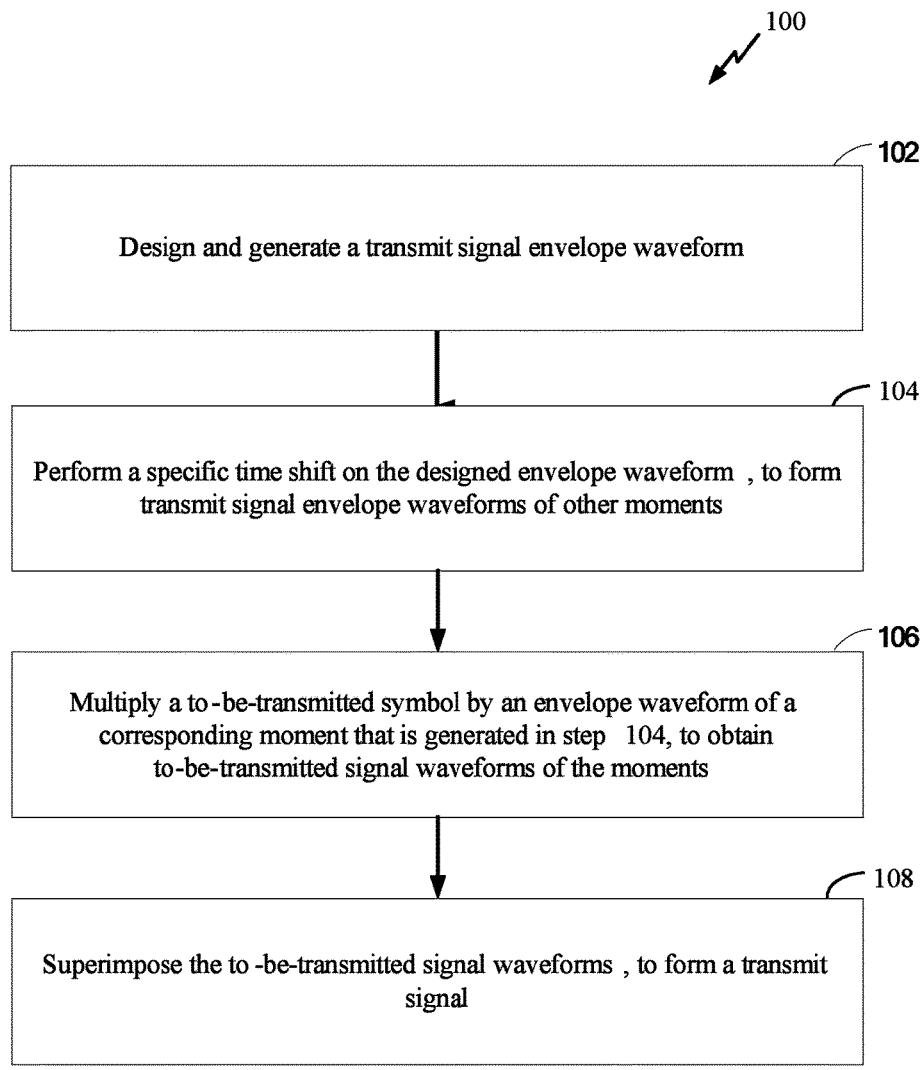
FIG. 1 is an example flowchart of a transmit signal generation procedure in an OvTDM system.

FIG. 1 is an example flowchart of a transmit signal generation procedure in a system. The transmit signal generation procedure 100 includes: Step 102: Design and generate a transmit signal envelope waveform h(t). Step 104: Perform a specific time shift on the designed envelope waveform h(t), to form transmit signal envelope waveforms h(t−i×ΔT) of other moments. Step 106: Multiply a to-be-transmitted symbol $x_i$ by an envelope waveform h(t−i×ΔT) of a corresponding moment that is generated in step 104, to obtain to-be-transmitted signal waveforms $x_i$h(t−i×ΔT) of the moments. Step 108: Superimpose the to-be-transmitted signal waveforms $x_i$h(t−i×ΔT), to form a transmit signal. In this embodiment, the transmit signal may be represented as $$s(t) = \sum_i x_i h(t - i \times \Delta T).$$

Figure 2:
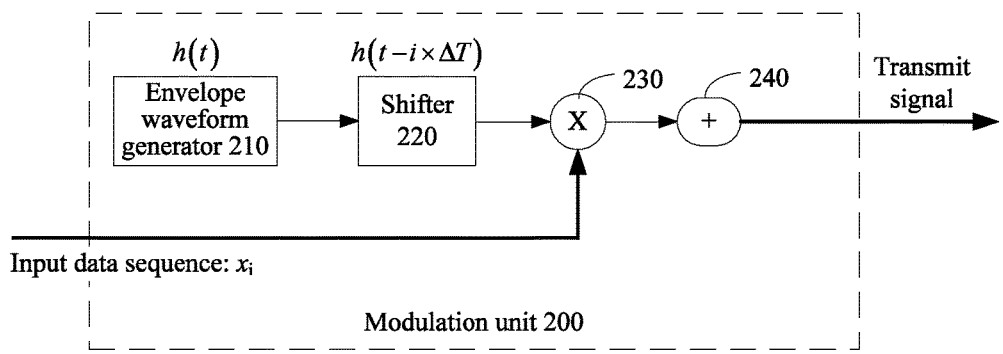
FIG. 2 is an example block diagram of a modulation unit in an OvTDM system.

FIG. 2 is an example block diagram of a modulation unit in a system. The modulation unit 200 includes: an envelope waveform generator 210, configured to generate a transmit signal envelope waveform; a shifter 220, configured to perform a specific time shift on the designed envelope waveform, to form transmit signal envelope waveforms of other moments; a multiplier 230, configured to multiply a to-be-transmitted symbol by an envelope waveform of a corresponding moment that is generated in the shifter 220, to obtain to-be-transmitted signal waveforms of the moments; and a superimposer 240, configured to superimpose the to-be-transmitted signal waveforms, to form a transmit signal.

Figure 3:
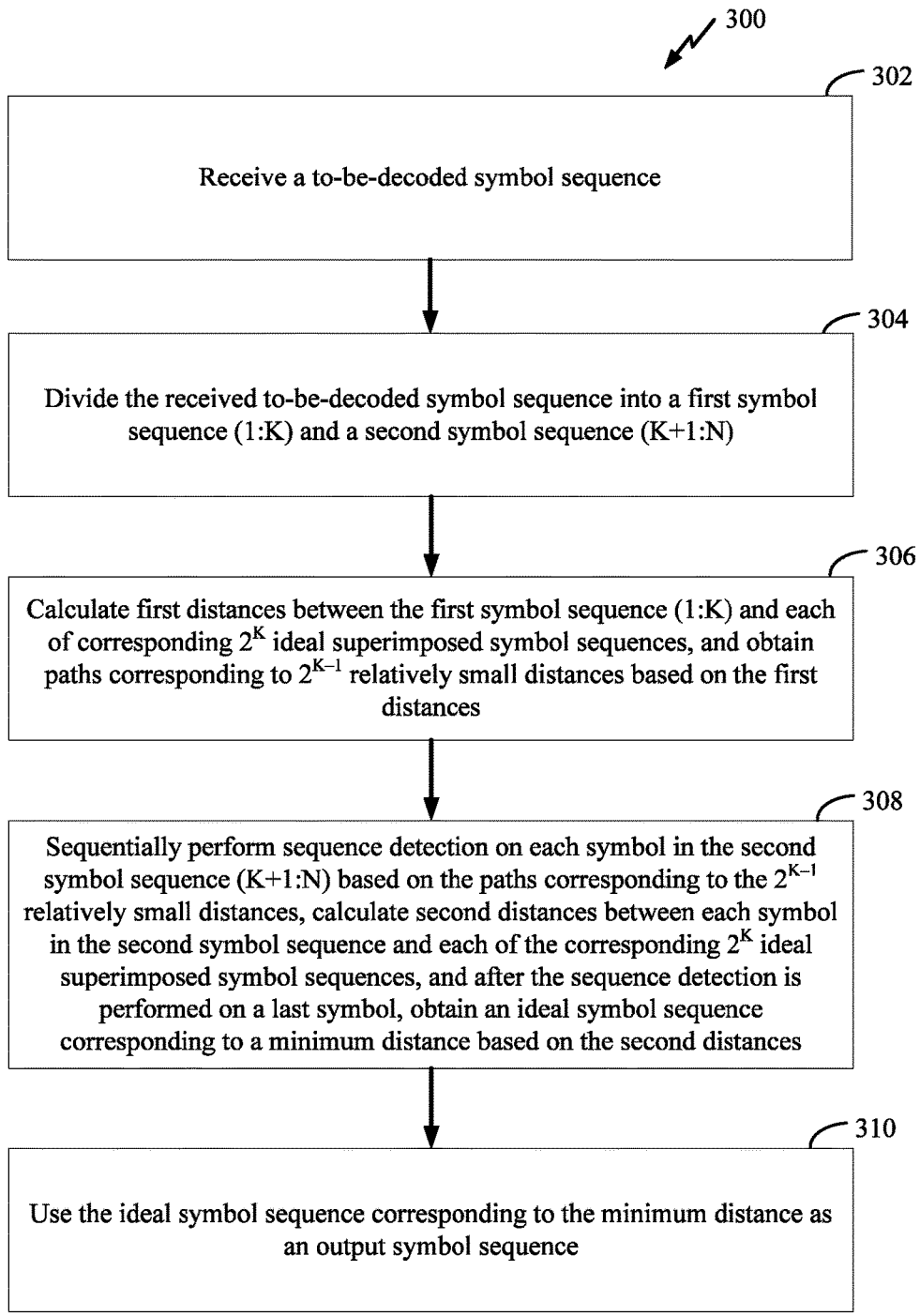
FIG. 3 is an example flowchart of a decoding method applied to an OvTDM system according to an embodiment of the present invention.

FIG. 3 is an example flowchart of a decoding method applied to an OvTDM system according to an embodiment of the present invention. The decoding method 300 includes: Step 302: Receive a to-be-decoded symbol sequence, where the to-be-decoded symbol sequence includes N symbols. Step 304: Divide the received to-be-decoded symbol sequence into a first symbol sequence (1:K) and a second symbol sequence (K+1:N), where K is the quantity of times of overlapped multiplexing. Step 306: Calculate first distances between the first symbol sequence (1:K) and each of corresponding $2^K$ ideal superimposed symbol sequences, and obtain paths corresponding to $2^{k-1}$ relatively small distances based on the first distances. Step 308: Sequentially perform sequence detection on each symbol in the second symbol sequence (K+1:N) based on the paths corresponding to the $2^{k-1}$ relatively small distances, calculate second distances between each symbol and each of the corresponding $2^K$ ideal superimposed symbol sequences, and after the sequence detection is performed on a last symbol, obtain an ideal symbol sequence corresponding to a minimum distance based on the second distances. Step 310: Use the ideal symbol sequence corresponding to the minimum distance as an output symbol sequence.

In an embodiment, both the first distances and the second distances are measure distances.

In an embodiment, the calculating first distances between the first symbol sequence (1:K) and each of corresponding $2^K$ ideal superimposed symbol sequences includes: generating, based on K symbols included in the first symbol sequence, all $2^K$ possible transmit symbol sequences corresponding to the K symbols; dividing all the possible transmit symbol sequences into a first part and a second part based on a first symbol in all the $2^K$ possible transmit symbol sequences, where each part includes $2^{k-1}$ possible transmit symbol sequences; sequentially accumulating each group of symbols in all the possible transmit symbol sequences level by level, to obtain K ideal superimposed symbol sequences; calculating a distance between a symbol in the first symbol sequence and each ideal superimposed symbol sequence, to obtain $2^K$ paths; and comparing distances of two corresponding possible transmit symbol sequences that are respectively in the first part and the second part and that are different only in a first symbol, to obtain $2^{k-1}$ relatively small distances and use the $2^{k-1}$ relatively small distances as the first distances.

In an embodiment, the calculating second distances between each symbol and each of the corresponding $2^K$ ideal symbol sequences includes: generating the $2^K$ ideal symbol sequences obtained after K symbols are superimposed; determining a state of a previous node of a current symbol; obtaining a state transition path based on the state of the previous node; and obtaining $2^{k-1}$ relatively small distances between the current symbol and ideal symbols based on the state transition path, and using the $2^{k-1}$ relatively small distances as the second distances.

In an embodiment, the second distances are distances obtained after accumulation of the current symbol.

In an implementable embodiment, the system is changed to an OvFDM system. In this case, at a stage of receiving a decoding signal, the received signal needs to be converted from a frequency domain to a time domain, that is, including: receiving a to-be-decoded signal; converting the to-be-decoded signal into a frequency-domain to-be-decoded symbol sequence, where the to-be-decoded symbol sequence includes N symbols; dividing the received to-be-decoded symbol sequence into a first symbol sequence (1:K) and a second symbol sequence (K+1:N); calculating first distances between the first symbol sequence (1:K) and each of corresponding $2^K$ ideal superimposed symbol sequences, and obtaining paths corresponding to $2^{k-1}$ relatively small distances based on the first distances; sequentially performing sequence detection on each symbol in the second symbol sequence (K+1:N) based on the paths corresponding to the $2^{k-1}$ relatively small distances, calculating second distances between each symbol and each of the corresponding $2^K$ ideal symbol sequences, and after the sequence detection is performed on a last symbol, obtaining an ideal symbol sequence corresponding to a minimum distance based on the second distances; and using the ideal symbol sequence corresponding to the minimum distance as an output symbol sequence.

Afterwards, subsequent decoding is performed.

Decoding on $y_i(1:K)$ Symbols

The K symbols are represented as $\tilde{a}_0, \tilde{a}_1, \ldots,$ and $\tilde{a}_{k-1}$. The K symbols are combined and permutated, and there are a total of $2^K$ types of possible combination information. A combination form is $\pm \tilde{a}_0 \pm \tilde{a}_1 \ldots \pm \tilde{a}_{k-1}$, and may be represented as msg($2^K*K$). A matrix msg may be divided into an upper part and a lower part: $msg_{sub1}$ and $msg_{sub2}$. Each part includes $2^{k-1}$ rows. Sizes of the two parts are $msg_{sub1}$ ($2^{K-1}*K$) and $msg_{sub2}$($2^{K-1}*K$). An only difference between the two parts lies in a first symbol ±1, and permutations and combinations of the following K−1 symbols in the upper part are the same as those in the lower part. That is, whether the first symbol belongs to a +1 branch or a −1 branch can be distinguished based on upper and lower grouping.

A result of sequentially accumulating each group of symbols level by level is recorded sequentially, to obtain each ideal superimposed symbol combination, which may be represented as a matrix M($2^K*K$), that is, $2^K$ rows and K columns. The matrix is represented as $[\pm \tilde{a}_0 \pm \tilde{a}_0 \pm \tilde{a}_1 \ldots \pm \tilde{a}_0 \pm \tilde{a}_1 \ldots \pm \tilde{a}_{k-1}]$. A first column is a possible permutation of a first group of symbols, a second column is a possible permutation of the first two groups of symbols that are superimposed, a third column is a possible permutation of the first three groups of symbols that are superimposed, and so on, and a $K^{th}$ column is a possible permutation of all K groups of symbols that are superimposed. The matrix M may be divided into an upper part and a lower part: $M_{sub1}$ and $M_{sub2}$, to distinguish whether a new incoming symbol is +1 or −1. Each part includes $2^{k-1}$ rows. Sizes of the two parts are $M_{sub1}$($2^{K-1}*K$) and $M_{sub2}$($2^{K-1}*K$).

The first K symbols y(1:K) are taken from the received to-be-decoded symbol sequence $y_i$ (i=1~N). A measure distance between each of the K symbols and each row in the matrix M is calculated sequentially. The measure distance may be represented as $d = \sqrt[p]{|y_i - x_i|^p}$, $0 < p < \infty$, and is an Euclidean distance when p is 2. The Euclidean distance is a real distance between two signals, can truly reflect a distance between an actual signal and an ideal signal, and may be correspondingly represented as $$d = \sqrt{\sum_i^N (y_i - x_i)^2}$$

(which means a real distance between two vectors). There are a total of $2^K$ paths. Because an only difference between the matrixes $M_{sub1}$ and $M_{sub2}$ lies in a first symbol, only $2^{k-1}$ possible paths are retained each time a best path is calculated for K groups of symbols.

A comparison procedure is: respectively calculating measure distances between y(1:K) and first rows in $M_{sub1}$ and $M_{sub2}$, finding a path with a smaller distance of the two distances, recording a measure distance $d_1$ of this path and a corresponding symbol sequence path $path_1$ in msg, and discarding the other path; then, respectively calculating measure distances between y(1:K) and second rows in $M_{sub1}$ and $M_{sub2}$, retaining a best path, recording a measure distance $d_2$ of this path and a corresponding symbol sequence path $path_2$ in msg, and discarding the other path; and so on, until a $(2^{k-1})^{th}$ row.

$2^{k-1}$ best paths are finally obtained. Measure distances of the paths are recorded as $d_i$, $i=1\sim 2^{K-1}$ and represented as $d_1$, $d_2 \ldots d_{2^{K-1}}$. Symbol sequence paths are recorded as $path_i$, $i=1\sim 2^{K-1}$ and represented as $path_1$, $path_2$, $\ldots$ $path_{2^{K-1}}$. Because only the first K symbols are parsed, a path depth of each path is K in this case.

Decoding on $y_i(K+1:N)$ Symbols

The first K symbols are decoded during decoding on the y(1:K) symbols. In addition, the $2^{k-1}$ best paths $path_i$ and corresponding accumulated measure distances $d_i$ are finally obtained. Each symbol after the K symbols is a possible result obtained after K symbols are superimposed. Therefore, sequence detection is sequentially performed on (K+1:N) symbols, and a total of N-K sequence detection procedures are performed. Sequence detection steps are as follows:

Generate possible states obtained after K symbols are superimposed, namely, ideal symbols $S_{theory}(i)$, $i=1\sim 2^K$. There are a total of $2^k$ possible states. A corresponding representation form after superimposition is $\pm\tilde{a}_0$ $\pm\tilde{a}_1$ $\ldots$ $\pm\tilde{a}_{k-1}$. If $\pm 1$ is used to represent an output level after superimposition, after the K symbols are superimposed, only K+1 symbol levels are possibly included, which are sequentially $\pm K$, $\pm(K-2)$, $\ldots$, and $\pm(K-2^i)$, where $i=1\sim K/2$, and recorded as $Y_{theory}(index)$, $index=1\sim K+1$.

Determine a state of a previous node of a current symbol $y_i$ ($i=k+1\sim N$). The $2^{k-1}$ $path_i$ are obtained during decoding on the y(1:K) symbols, that is, there are a total of $2^{k-1}$ states. In a symbol superimposition procedure, a first symbol is a new symbol, and the rest K-1 symbols are symbol states of the previous node. Therefore, path(i-(K-1):i-1) is compared with the $2^{k-1}$ possible states, to determine the state of the previous node.

Determine a node state transition path. Two new states (enter +1/-1) are generated for each node after state transition, that is, the $2^{k-1}$ states change to $2^K$ states after node transition.

Determine a measure distance between a current symbol $y_i$ and an ideal symbol $S_{theory}(i)$:

$$d_{current}(i) = \sqrt[p]{(y - S_{theory}(i))^p}, i = 1 \sim 2^K, 0 < p < \infty.$$

When p is 2, the measure distance is an Euclidean distance. The Euclidean distance is a real distance between two signals, and can truly reflect a distance between an actual signal and an ideal signal. A corresponding expression is:

$$d_{current}(i) = \sqrt{(y - S_{theory}(i))^2}, i=1\sim 2^K.$$

In an embodiment, if a multiplexing waveform is a square wave, a measure distance can be directly calculated by using $Y_{theory}(index)$.

Calculate an accumulated measure distance. An expression of the accumulated measure distance is recorded as:

$$D_{m,n} = d_i\left(\frac{n+1}{2}\right) + d_{current}(n), m = K+1 \sim N, n = 1 \sim 2^K$$

$$i = m - 1,$$

where $D_{m,n}$ represents a measure distance obtained after accumulation of the current symbol, m represents an index of the current symbol in an entire received symbol sequence, n represents an index of an accumulated symbol (there are a total of $2^K$ indexes), and $d_i$ represents an accumulated measure distance after a current node previously performs selection (there are a total of $2^{k-1}$ accumulated measure distances). In actual processing, a $d_i$ value corresponding to a $(K+1)^{th}$ symbol is the measure distance $d_i$ in the foregoing decoding on the y(1:K) symbols; a $d_i$ value of a $(K+2)^{th}$ symbol changes to $D_{(k+1)}$; and so on; and a $d_i$ value of an $N^{th}$ symbol changes to $D_{(N-1)}$. A value of $d_{current}$ is always the measure distance between the current symbol and the ideal symbol.

Select a best path. After the foregoing processing, $2^K$ measure distances $D_{m,n}$ and paths $path_i$ are obtained. The $2^K$ paths may be generally divided into two parts, that is, whether +1 or -1 is entered in a previous state. Therefore, the $2^K$ paths are divided into two parts, and each part includes $2^{k-1}$ paths. A measure distance of each row in each part is compared with that of each corresponding row in the other part. That is, a first row in a first part is compared with a first row in a second part, a second row in the first part is compared with a second row in the second part, and so on. A minimum measure distance of each row is calculated. An accumulated measure distance $D_{m,n}$ corresponding to this row is recorded and marked as a new measure distance d. In addition, a corresponding symbol path is retained. Enter +1 or enter -1 for a current symbol based on a transition path, and increase a depth of a corresponding path by 1. Therefore, $2^{k-1}$ measure distances and $2^{k-1}$ corresponding symbol paths are further obtained.

Sequentially process the K+1 to N symbols based on the foregoing steps. When a last symbol $y_N$ is processed, the $2^{k-1}$ measure distances d and the corresponding $2^{k-1}$ symbol paths are obtained. In this case, a path depth is N. Sort the $2^{k-1}$ measure distances in ascending order. Find a measure distance with a smallest accumulated distance, and obtain an index corresponding to the measure distance. Based on the index, take a decoded symbol sequence of an index corresponding to the path. The decoded symbol sequence is a final decoding result. Record a decoded sequence as $S_{decoder}(i)$, $i=1\sim N$. Compare the decoded sequence $S_{decoder}(i)$ with an input sequence $x_i$, to check whether the decoding result is correct and calculate a bit error rate of the system.

Figure 4:
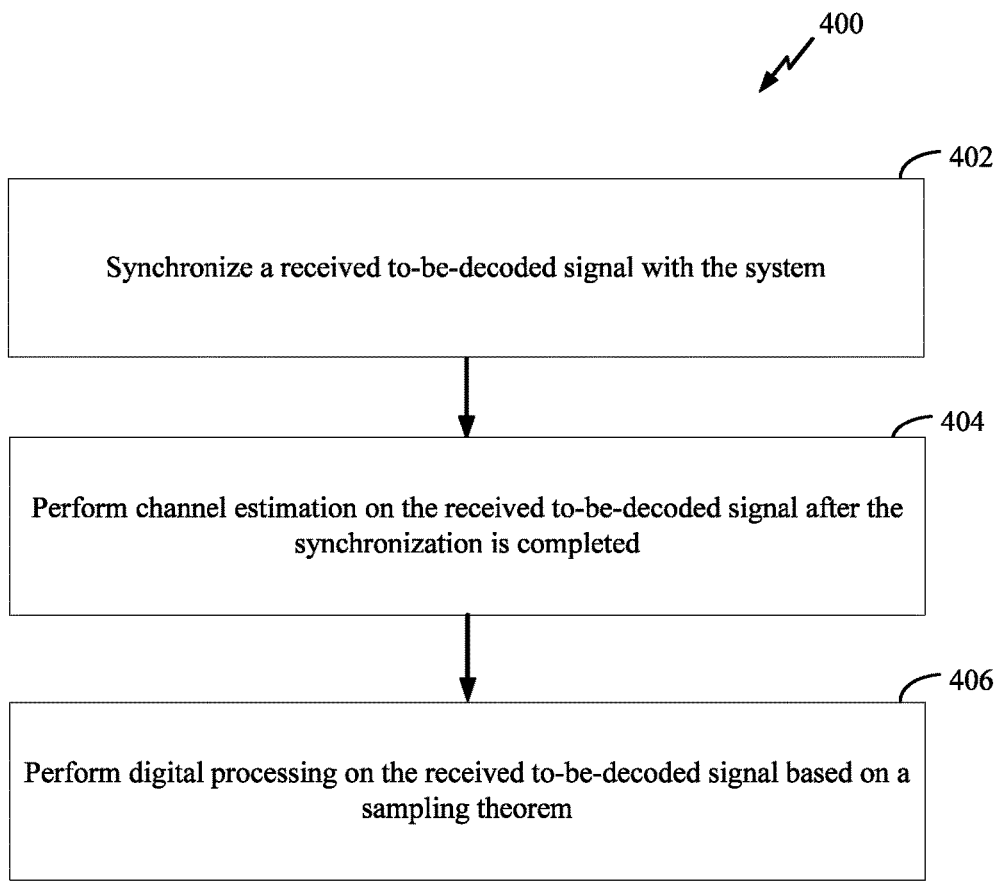
FIG. 4 is a flowchart of a preprocessing procedure before a to-be-decoded signal is decoded in a decoding method applied to an OvTDM system according to an embodiment of the present invention.

Referring to FIG. 4, before a to-be-decoded signal is decoded, a decoding method applied to an OvTDM system according to an embodiment of the present invention may further include a preprocessing procedure 400. The preprocessing procedure 400 includes: 402: Synchronize a received to-be-decoded signal with the OvTDM system, where the synchronization may be timing synchronization or carrier synchronization. 404: Perform channel estimation on the received to-be-decoded signal after the synchronization is completed, where the channel estimation is used to estimate a parameter of an actual transmission channel. 406: Perform digital processing on the received to-be-decoded signal based on a sampling theorem, where the digital processing may include cutting a received waveform based on a waveform transmit time interval.

According to the decoding method applied to the OvTDM system in the present invention, a decoding procedure is divided into two parts: (1:K) decoding and (K+1:N) decoding. One-time processing is performed on the first K signals. The K signals are sequentially accumulated level by level to obtain new K ideal signals. Measure distances of the new ideal signals are sequentially calculated by using the first K signals in an actual received symbol sequence. $2^{k-1}$ best paths are retained. An actual accurate path is definitely included in the $2^{k-1}$ paths, thereby improving a decoding success rate. However, for a truncated system, the first K−1 symbols of the system are known, that is, in a communication procedure, a transmit end and a receive end of the first K−1 symbols know each other and reach an agreement, and the first K−1 symbols do not need to be decoded. A decoding sequence starts from a $K^{th}$ symbol, namely, $y_i(K:N)$. A total of N−K+1 symbol sequences need to be detected. By using the truncated system, decoding efficiency can be improved, and system design complexity can be reduced.

A measure distance is used to select a best path. The measure distance represents a distance between two signals. During selection of the best path, a path with a smallest measure distance is selected as the best path. Therefore, a path closest to an ideal signal can be accurately found, thereby improving a decoding success rate of a system.

When measure distances are compared, if only a measure distance between a current symbol and an ideal symbol is compared, a best path may have a deviation as a decoding depth increases, and consequently, a final decoding success rate decreases. K symbols are overlapped with each other in a symbol superimposition procedure, and the symbols are closely associated. Therefore, a best path may be determined by using a current measure distance and a sum of previously accumulated measure distances. In this way, the best path can be determined more accurately as the decoding depth increases, thereby improving the decoding success rate.

In a specific embodiment of the present invention, an encoding/decoding procedure is described by using a square wave as a multiplexing waveform. The quantity of times K of overlapped multiplexing is set to 3. As shown in FIG. 5, an input sequence is $x_i=\{+1\ +1\ -1\ +1\ -1\ +1\ +1\ +1\ -1\ +1\}$, and an encoded output sequence is $s(t)=\{+1\ +2\ +1\ +1\ -1\ +1\ +1\ +3\ +1\ +1\}$. As shown in FIG. 5, the first two symbols of the encoded output are not superimposition results of three signals.

An encoded signal is transmitted through an actual channel. A to-be-decoded symbol sequence received at a receive end has a deviation and is recorded as $y_i$, where i=1~10. A received symbol sequence in this embodiment is $y_i=\{-0.0123, 1.0439, 0.369, 0.6781, -0.5921, 1.0252, 0.2574, 2.0371, 0.8769, 0.9036\}$. When p in a measure distance $$d = \sqrt[p]{|y_i - x_i|^p}, 0 < p < \infty$$

is 2, the measure distance is correspondingly an Euclidean distance. Decoding steps are described by using the Euclidean distance as an example.

First, decode the first three symbols. As shown in FIG. 6, there are a total of eight permutations and combinations, forming an 8×3 matrix. Symbols are sequentially accumulated level by level, forming the 8×3 matrix. The matrix is divided into two parts: $M_{sub1}$ and $M_{sub2}$. A difference between $M_{sub1}$ and $M_{sub2}$ lies in: A first symbol of $M_{sub1}$ is 1, and a first symbol of $M_{sub2}$ is −1; alternatively, a first symbol of $M_{sub1}$ is −1, and a first symbol of $M_{sub2}$ is 1.

Compare an Euclidean distance between the first three symbols of $y_i$ and a first row in the matrix M with that between the first three symbols of $y_i$ and a fifth row in the matrix M, compare an Euclidean distance between the first three symbols of $y_i$ and a second row in the matrix M with that between the first three symbols of $y_i$ and a sixth row in the matrix M, . . . , and compare an Euclidean distance between the first three symbols of $y_i$ and a fourth row in the matrix M with that between the first three symbols of $y_i$ and an eighth row in the matrix M, to obtain Euclidean distances of the fifth row, the second row, the third row, and the fourth row, which are respectively recorded as d1, d2, d3, and d4. In addition, a path corresponding to each row is recorded, namely, a fifth row, a second row, a third row, and a fourth row of msg. Therefore, four possible paths are obtained from decoding of the first three symbols, a symbol sequence corresponding to the paths is: $path_1$: (−1 1 1), $path_2$: (1 1 −1), $path_3$: (1 −1 1), $path_4$: (1 −1 −1).

Figure 7:
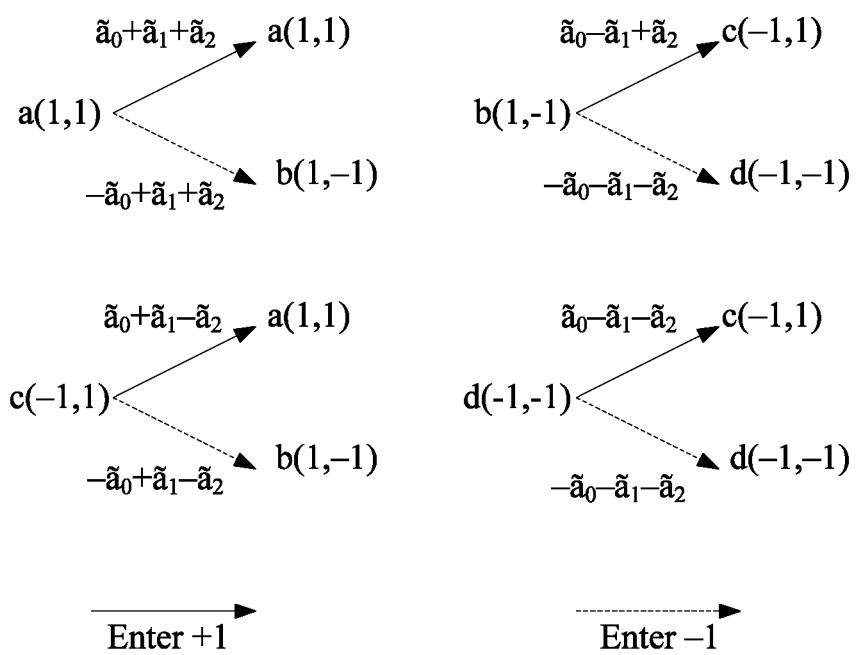
FIG. 7 is a node state transition diagram according to an embodiment of the present invention.
Figure 8:
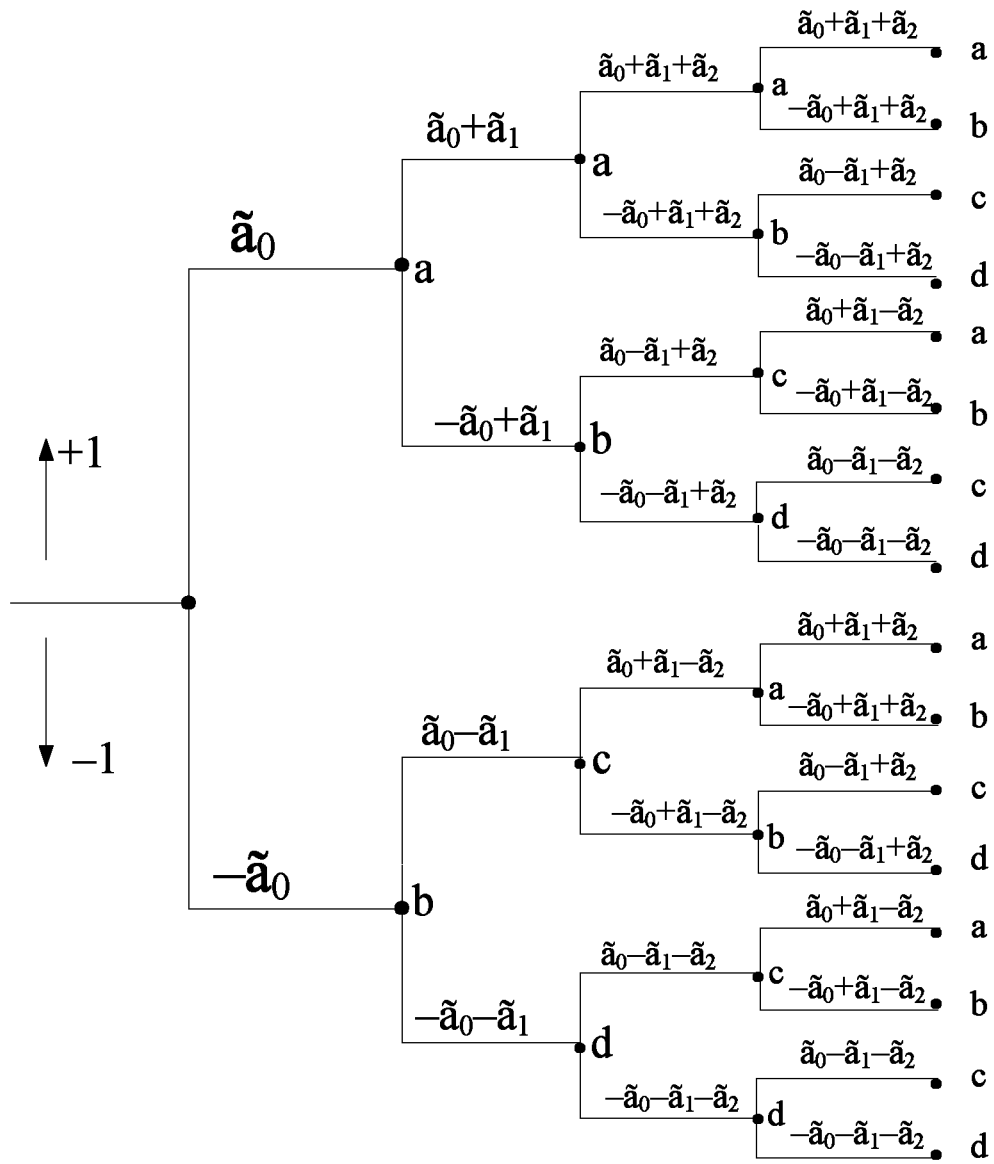
FIG. 8 is an input-output relationship tree diagram of an OvTDM system according to an embodiment of the present invention.

Then, decode the fourth to tenth symbols. When K=3, there are four states: a, b, c, and d. Corresponding symbols are (1, 1), (1, −1), (−1, 1), and (−1, −1). Each time, the last two symbols in a path sequence are compared with the four states, to determine a state of a previous node. For a transition path, refer to a node state transition diagram. Based on the node state transition diagram in FIG. 7, it can be learned that $path_1$ is corresponding to a node a, $path_2$ is corresponding to a node b, $path_3$ is corresponding to a node c, and $path_4$ is corresponding to a node d. When K=3, an input-output relationship diagram is shown in FIG. 8. It can be learned from the figure that the node a is (1, 1), the node b is (1, −1), the node c is (−1, 1), and the node d is (−1, −1).

When K=3, there are a total of four possible symbol levels after superimposition: ±3 and ±1, that is, $Y_{theory}(1)=-3$, $Y_{theory}(2)=-1$, $Y_{theory}(3)=1$, and $Y_{theory}(4)=3$. Corresponding ideal symbol representation forms are respectively: $S_{theory}(1)=ã_0+ã_1+ã_2$, $S_{theory}(2)=ã_0+ã_1-ã_2$, $S_{theory}(3)=ã_0-ã_1+ã_2$, $S_{theory}(4)=ã_0-ã_1-ã_2$, $S_{theory}(5)=-ã_0+ã_1+ã_2$, $S_{theory}(6)=-ã_0+ã_1-ã_2$, $S_{theory}(7)=-ã_0-ã_1+ã_2$, and $S_{theory}(8)=-ã_0-ã_1-ã_2$.

Respectively calculate Euclidean distances by using a fourth symbol $y_4$ and the four levels:

When a path node is a, +3 is obtained after +1 is entered, that is, node transition is a->a, and an Euclidean distance obtained by using $y_4$ and +3 is recorded as $d_{current}(1)$; +1 is obtained after −1 is entered, that is, node transition is a->b, and an Euclidean distance obtained by using $y_4$ and +1 is recorded as $d_{current}(2)$.

When a path node is b, +1 is obtained after +1 is entered, that is, node transition is b->c, and an Euclidean distance obtained by using $y_4$ and +1 is recorded as $d_{current}(3)$; −1 is obtained after −1 is entered, that is, node transition is b->d, and an Euclidean distance obtained by using $y_4$ and −1 is recorded as $d_{current}(4)$.

When a path node is c, +1 is obtained after +1 is entered, that is, node transition is c->a, and an Euclidean distance obtained by using $y_4$ and +1 is recorded as $d_{current}(5)$; −1 is obtained after −1 is entered, that is, node transition is c->b, and an Euclidean distance obtained by using $y_4$ and −1 is recorded as $d_{current}(6)$.

When a path node is d, −1 is obtained after +1 is entered, that is, node transition is d->c, and an Euclidean distance obtained by using $y_4$ and −1 is recorded as $d_{current}(7)$; −3 is obtained after −1 is entered, that is, node transition is d->d, and an Euclidean distance obtained by using $y_4$ and −3 is recorded as $d_{current}(8)$.

Respectively add the Euclidean distance $d_{current}$ of the current symbol up to Euclidean distances $d_i$ corresponding to the first three symbols, to obtain accumulated distances, that is, $D_{4,1}=d_1+d_{current}(1)$, $D_{4,2}=d_1+d_{current}(2)$; $D_{4,3}=d_2+d_{current}(3)$, $D_{4,4}=d_2+d_{current}(4)$; $D_{4,5}=d_3+d_{current}(5)$, $D_{4,6}=d_3+d_{current}(6)$; $D_{4,7}=d_4+d_{current}(7)$, and $D_{4,8}=d_4+d_{current}(8)$.

Calculate a best path.

Compare Euclidean distances $D_{4,1}$ and $D_{4,5}$. It is learned that the Euclidean distance $D_{4,5}$ is smaller. Record the smaller Euclidean distance $D_{4,5}$ and mark it as a new $d_1$. A path corresponding to a previous accumulated Euclidean distance $d_3$ of a current node in the $D_{4,5}$ is a $path_3$ sequence. Therefore, increase a depth of the $path_3$ from 3 to 4, and record a fourth symbol as +1. A new symbol path sequence (1 −1 1 1) is obtained. Record the symbol path sequence as a new $path_1$.

Compare Euclidean distances $D_{4,2}$ and $D_{4,6}$. It is learned that the Euclidean distance $D_{4,2}$ is smaller. Record the smaller Euclidean distance $D_{4,2}$ and mark it as a new $d_2$. A path corresponding to a previous accumulated Euclidean distance $d_1$ of a current node in the $D_{4,2}$ is a $path_1$ sequence. Therefore, increase a depth of the $path_1$ from 3 to 4, and record a fourth symbol as −1. A new symbol path sequence (−1 1 1 −1) is obtained. Record the symbol path sequence as a new $path_2$.

Compare Euclidean distances $D_{4,3}$ and $D_{4,7}$. It is learned that the Euclidean distance $D_{4,3}$ is smaller. Record the smaller Euclidean distance $D_{4,3}$ and mark it as a new $d_3$. A path corresponding to a previous accumulated Euclidean distance $d_2$ of a current node in the $D_{4,3}$ is a $path_2$ sequence. Therefore, increase a depth of the $path_2$ from 3 to 4, and record a fourth symbol as +1. A new symbol path sequence (1 1 −1 1) is obtained. Record the symbol path sequence as a new $path_3$.

Compare Euclidean distances $D_{4,4}$ and $D_{4,8}$. It is learned that the Euclidean distance $D_{4,4}$ is smaller. Record the smaller Euclidean distance $D_{4,4}$ and mark it as a new $d_4$. A path corresponding to a previous accumulated Euclidean distance $d_2$ of a current node in the $D_{4,4}$ is a $path_2$ sequence. Therefore, increase a depth of the $path_2$ from 3 to 4, and record a fourth symbol as −1. A new symbol path sequence (1 1 −1 −1) is obtained. Record the symbol path sequence as a new $path_4$.

To sum up, the following new possible best paths are obtained: $path_1$: (1 −1 1 1), $path_2$ (−1 1 1 −1), $path_3$: (1 1 −1 1), and $path_4$: (1 1 −1 −1).

Figure 9:
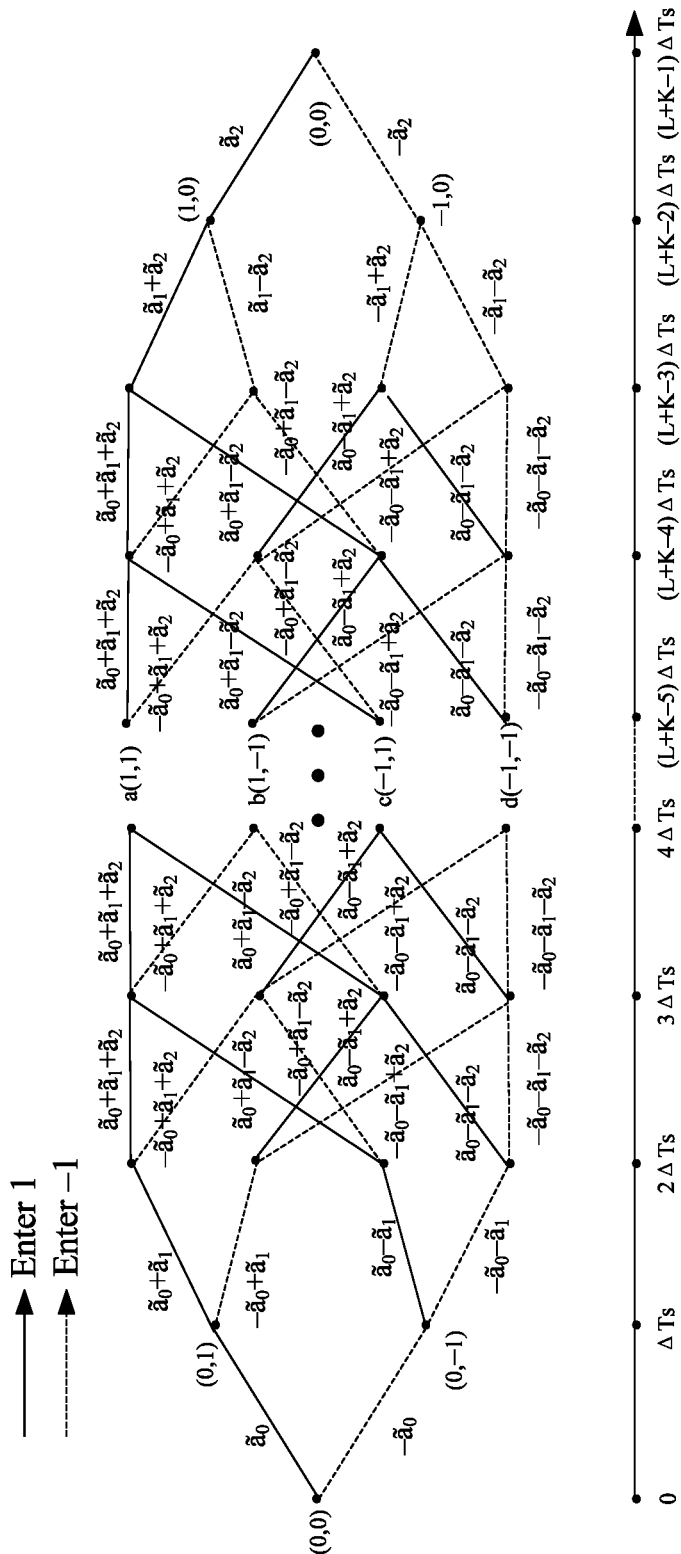
FIG. 9 is a K=3 OvTDM Trellis diagram according to an embodiment of the present invention.
Figure 10:
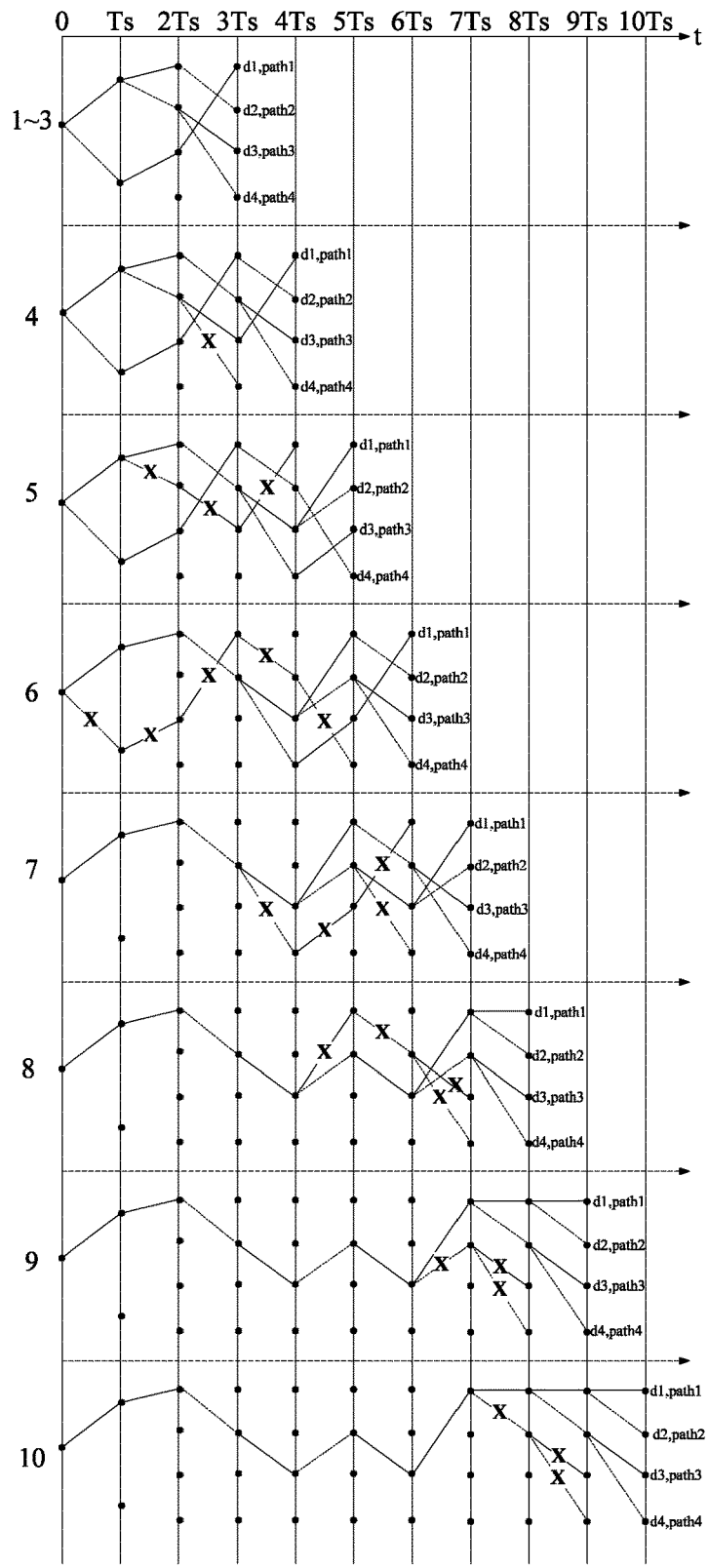
FIG. 10 is a symbol sequence detection path diagram according to an embodiment of the present invention.

Complete decoding all symbols. Likewise, perform sequence detection on the fifth to tenth symbols based on the foregoing method. Referring to a K=3 Trellis diagram in FIG. 9, an obtained symbol detection procedure is shown in FIG. 10. Finally obtained symbol sequences are sequentially: $path_1$: (1 1 −1 1 −1 1 1 1 1), $path_2$: (1 1 −1 1 −1 1 1 1 −1), $path_3$: (1 1 −1 1 −1 1 1 1 −1 1), and $path_4$: (1 1 −1 1 1 1 −1 −1). By comparing the $path_1$, $path_2$, $path_3$, and $path_4$, it can be found that paths with a same initial node in a path memory are gradually unified as a decoding depth increases. Therefore, paths with a same initial node among paths can be first output in a decoding procedure, to save storage space.

Corresponding Euclidean distances are sequentially $d_1$=3.5071, $d_2$=3.0049, $d_3$=2.4493, and $d_4$=3.6040. By comparing the four distances, it can be learned that the Euclidean distance $d_3$ is the smallest. Correspondingly, the $path_3$ is selected as the output symbol sequence. That is, the output symbol sequence is $S_{decode}$=(1 1 −1 1 −1 1 1 1 −1 1). Compared with the input symbol sequence $x_i$={+1 +1 −1 +1 −1 +1 +1 +1 −1 +1}, the two sequences are completely the same, indicating that a decoding result is correct.

In the present invention, a decoding apparatus applied to an OvTDM system includes: a unit configured to receive a to-be-decoded symbol sequence, where the to-be-decoded symbol sequence includes N symbols; a unit configured to divide the received to-be-decoded symbol sequence into a first symbol sequence (1:K) and a second symbol sequence (K+1:N); a unit configured to calculate first distances between the first symbol sequence (1:K) and each of corresponding $2^K$ ideal superimposed symbol sequences, and obtain paths corresponding to $2^{k-1}$ relatively small distances based on the first distances; a unit configured to sequentially perform sequence detection on each symbol in the second symbol sequence (K+1:N) based on the paths corresponding to the $2^{k-1}$ relatively small distances, calculate second distances between each symbol and each of the corresponding $2^K$ ideal symbol sequences, and after the sequence detection is performed on a last symbol, obtain an ideal symbol sequence corresponding to a minimum distance based on the second distances; and a unit configured to use the ideal symbol sequence corresponding to the minimum distance as an output symbol sequence.

In an embodiment, both the first distances and the second distances are measure distances.

In an embodiment, the second distances are distances obtained after accumulation of the current symbol.

In an embodiment, a decoding apparatus corresponding to an OvFDM system is provided. Compared with the decoding apparatus in the OvTDM system, a processing apparatus is added at a signal receiving stage in this decoding apparatus, to convert a frequency-domain signal into a time-domain signal. That is, the decoding apparatus applied to the OvFDM system in the present invention includes: a unit configured to receive a to-be-decoded signal; a unit configured to convert the to-be-decoded signal into a frequency-domain to-be-decoded symbol sequence, where the to-be-decoded symbol sequence includes N symbols; a unit configured to divide the received to-be-decoded symbol sequence into a first symbol sequence (1:K) and a second symbol sequence (K+1:N); a unit configured to calculate first distances between the first symbol sequence (1:K) and each of corresponding $2^K$ ideal superimposed symbol sequences, and obtain paths corresponding to $2^{k-1}$ relatively small distances based on the first distances; a unit configured to sequentially perform sequence detection on each symbol in the second symbol sequence (K+1:N) based on the paths corresponding to the $2^{k-1}$ relatively small distances, calculate second distances between each symbol and each of the corresponding $2^K$ ideal symbol sequences, and after the sequence detection is performed on a last symbol, obtain an ideal symbol sequence corresponding to a minimum distance based on the second distances; and a unit configured to use the ideal symbol sequence corresponding to the minimum distance as an output symbol sequence.

The decoding apparatus applied to the OvTDM/OvFDM system according to this embodiment of the present invention further includes a preprocessing unit configured to perform preprocessing on the to-be-decoded symbol sequence. The preprocessing unit includes: a synchronizer, configured to synchronize the received to-be-decoded signal with the system, where the synchronization may be timing synchronization or carrier synchronization; a channel estimator, configured to perform channel estimation on the received to-be-decoded signal after the synchronization is completed, where the channel estimation is used to estimate a parameter of an actual transmission channel; and a digital processor, configured to perform digital processing on the received to-be-decoded signal based on a sampling theorem.

According to the decoding apparatus applied to the OvTDM system in the present invention, a decoding procedure is divided into two parts: (1:K) decoding and (K+1:N) decoding. One-time processing is performed on the first K signals. The K signals are sequentially accumulated level by level to obtain new K ideal signals. Measure distances of the new ideal signals are sequentially calculated by using the first K signals in an actual received symbol sequence. $2^{k-1}$ best paths are retained. An actual accurate path is definitely included in the $2^{k-1}$ paths, thereby improving a decoding success rate. However, for a truncated system, the first K−1 symbols of the system are known, that is, in a communication procedure, a transmit end and a receive end of the first K−1 symbols know each other and reach an agreement, and the first K−1 symbols do not need to be decoded. A decoding sequence starts from a $K^{th}$ symbol, namely, $y_i(K:N)$. A total of N−K+1 symbol sequences need to be detected. By using the truncated system, decoding efficiency can be improved, and system design complexity can be reduced.

A measure distance is used to select a best path. The measure distance represents a distance between two signals. During selection of the best path, a path with a smallest measure distance is selected as the best path. Therefore, a path closest to an ideal signal can be accurately found, thereby improving a decoding success rate of a system.

When measure distances are compared, if only a measure distance between a current symbol and an ideal symbol is compared, a best path may have a deviation as a decoding depth increases, and consequently, a final decoding success rate decreases. K symbols are overlapped with each other in a symbol superimposition procedure, and the symbols are closely associated. Therefore, a best path may be determined by using a current measure distance and a sum of previously accumulated measure distances. In this way, the best path can be determined more accurately as the decoding depth increases, thereby improving the decoding success rate.

Generally, a length of to-be-decoded data is relatively large, and an accumulated distance increases as a decoding depth increases. If a system performs decoding output after all data is decoded, system resource consumption is relatively large. Therefore, a better processing method is used for a path storage capacity and distance storage. Usually, a path storage length of 4K-5K is selected. In this case, if a path memory is full but decoding decision output has not been performed, decision output may be performed forcibly, and the output is first performed for initial nodes having a same path. The accumulated distance increases as the decoding depth increases. In this case, the accumulated distance may be stored as a relative distance. In other words, a reference distance is defined, and a value of the reference distance varies depending on a system. In distance storage, a relative value of a second distance of each path relative to the reference distance is recorded. During selection of a best path, comparison is performed based on the relative distance.

The decoding apparatus applied to the OvTDM/OvFDM system in the foregoing embodiment of the present invention may be combined in the OvTDM/OvFDM system.

The present invention may be further applied to a truncated OvTDM/OvFDM system. In the truncated OvTDM/OvFDM system, considering that the first K−1 symbols $y_i(1:K-1)$ in superimposed symbols do not result from superimposition of K symbols, decoding on the first K−1 symbols is relatively complex in an actual decoding procedure. Therefore, a truncated system may be designed and exist, and in the system, the first K−1 symbols are known, that is, in a communication procedure, a transmit end and a receive end of the first K−1 symbols know each other and reach an agreement, and the first K−1 symbols do not need to be decoded. A decoding sequence starts from a $K^{th}$ symbol, namely, $y_i(K:N)$. A total of N−K+1 symbol sequences need to be detected.

Figure 11:
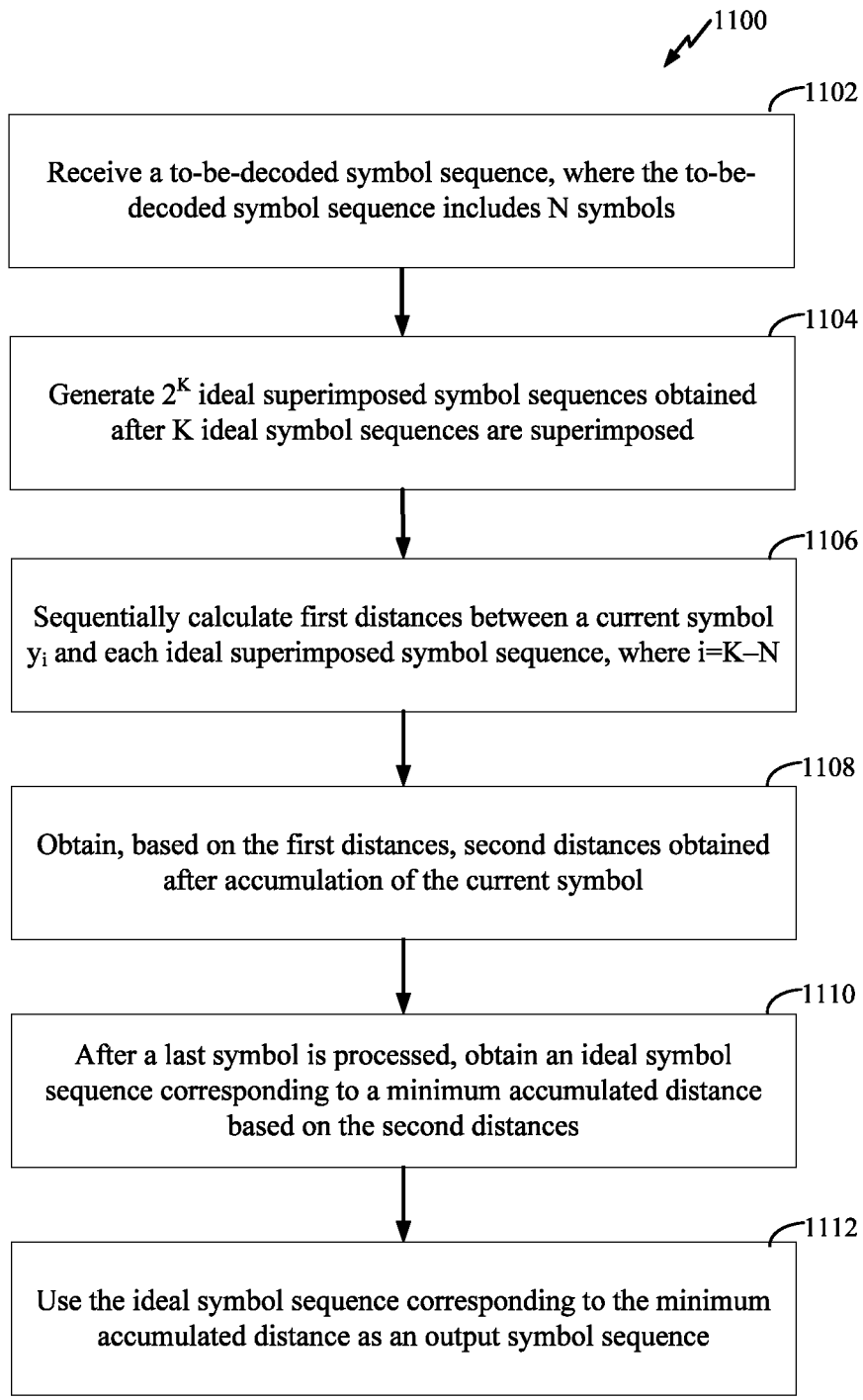
FIG. 11 is an example flowchart of a decoding method applied to a truncated OvTDM system according to an embodiment of the present invention.

FIG. 11 is an example flowchart of a decoding method applied to a truncated OvTDM system according to an embodiment of the present invention. The decoding method 1100 includes: Step 1102: Receive a to-be-decoded symbol sequence, where the to-be-decoded symbol sequence includes N symbols. Step 1104: Generate $2^K$ ideal superimposed symbol sequences obtained after K ideal symbol sequences are superimposed. Step 1106: Sequentially calculate first distances between a current symbol $y_i$ and each ideal superimposed symbol sequence, where i=K~N. Step 1108: Obtain, based on the first distances, second distances obtained after accumulation of the current symbol. Step 1110: After a last symbol $y_N$ is processed, obtain an ideal symbol sequence corresponding to a minimum accumulated distance based on the second distances. Step 1112: Use the ideal symbol sequence corresponding to the minimum accumulated distance as an output symbol sequence.

In this case, for a truncated OvFDM system, at a stage of receiving a decoding signal, the received signal needs to be converted from a frequency domain to a time domain, that is, including: receiving a to-be-decoded signal, and converting the to-be-decoded signal into a frequency-domain to-be-decoded symbol sequence, where the to-be-decoded symbol sequence includes N symbols; generating $2^K$ ideal superimposed symbol sequences obtained after K ideal symbol sequences are superimposed; sequentially calculating first distances between a current symbol $y_i$ and each ideal superimposed symbol sequence, where i=K~N; obtaining, based on the first distances, second distances obtained after accumulation of the current symbol; after a last symbol $y_N$ is processed, obtaining an ideal symbol sequence corresponding to a minimum accumulated distance based on the second distances; and using the ideal symbol sequence corresponding to the minimum accumulated distance as an output symbol sequence.

According to an embodiment of the present invention, K is the quantity of times of overlapped multiplexing.

According to an embodiment of the present invention, both the first distances and the second distances are measure distances.

According to an aspect of the present invention, the obtaining, based on the first distances, second distances obtained after accumulation of the current symbol includes: obtaining an accumulated distance of a previous node of the current symbol; and using, as the second distances, sums of the first distances between the current symbol and ideal symbols and the accumulated distance of the previous node of the current symbol.

In an embodiment of the present invention, N symbol sequences are received for the received signal, and a corresponding sequence is $y_i$. Because the first K−1 symbols $y_i(1:K-1)$ do not result from superimposition of K symbols, decoding on the first K−1 symbols is relatively complex in an actual decoding procedure. Therefore, a truncated OvTDM system may be designed and exist, and in the system, the first K−1 symbols are known, that is, in a communication procedure, a transmit end and a receive end of the first K−1 symbols know each other and reach an agreement, and the first K−1 symbols do not need to be decoded. A decoding sequence starts from a $K^{th}$ symbol, namely, $y_i(K:N)$. A total of N−K+1 symbol sequences need to be detected.

Decoding on $y_i(K:N)$ Symbols

Generate possible states obtained after K symbols are superimposed, namely, ideal symbols $S_{theory}(i)$, $i=1\sim2^K$. There are a total of $2^k$ possible states. The K symbols are represented as $\tilde{a}_0, \tilde{a}_1, \ldots,$ and $\tilde{a}_{k-1}$, and a corresponding representation form after superimposition is $\pm\tilde{a}_0 \pm\tilde{a}_1 \ldots \pm\tilde{a}_{k-1}$. If $\pm 1$ is used to represent an output level after superimposition, after the K symbols are superimposed, only K+1 symbol levels are possibly included, which are sequentially $\pm K$, $\pm(K-2)$, ..., and $\pm(K-2^i)$, where i=1~K/2 and recorded as $Y_{theory}$(index), index=1~K+1.

Sequentially calculate measure distances by using a current symbol $y_i$ and the foregoing generated $2^k$ ideal symbols $S_{theory}$ (i), to obtain $2^k$ measure distances. The measure distance may be represented as $$d = \sqrt[p]{|y_i - x_i|^p}, 0 < p < \infty,$$

and is an Euclidean distance when p is 2. The Euclidean distance is a real distance between two signals, can truly reflect a distance between an actual signal and an ideal signal, and may be correspondingly represented as:

$$d_{current}(i) = \sqrt{(y - S_{theory}(i))^2}, i=1\sim 2^K.$$

Calculate an accumulated measure distance. An expression of the accumulated measure distance is recorded as:

$$D_{m,n} = d_i\left(\frac{n+1}{2}\right) + d_{current}(n), m = K+1 \sim N, n = 1 \sim 2^K$$
$$i = m - 1,$$

where $D_{m,n}$ represents a measure distance obtained after accumulation of the current symbol, m represents an index of the current symbol in an entire received symbol sequence, n represents an index of an accumulated symbol (there are a total of $2^K$ indexes), and $d_i$ represents an accumulated measure distance after a current node previously performs selection. Because an only difference between the $2^K$ states lies in a first symbol, only $2^{k-1}$ measure distances and $2^{k-1}$ best paths are finally retained. Because the first K−1 symbols are not processed, it is considered by default that a $d_i$ value corresponding to a $K^{th}$ symbol is the same, a path depth is K−1, and a path sequence is set to 0. Starting from a $(K+1)^{th}$ symbol, a $d_i$ value changes to $D_{m,n}$, that is, an accumulated measure distance of a previous node, and so on, and a $d_i$ value of an $N^{th}$ symbol changes to $D_{(N-1)}$.

Select a best path. After the foregoing processing, $2^K$ Euclidean distances $D_{m,n}$ and paths $path_i$ are obtained. The $2^K$ paths may be generally divided into two parts, that is, whether +1 or −1 is entered in a previous state. Therefore, the $2^K$ paths are divided into two parts, and each part includes $2^{k-1}$ paths. A measure distance of each row in each part is compared with that of each corresponding row in the other part. That is, a first row in a first part is compared with a first row in a second part, a second row in the first part is compared with a second row in the second part, and so on. A minimum Euclidean distance of each row is calculated. An accumulated measure distance $D_{m,n}$ corresponding to this row is recorded and marked as a new measure distance $d_i$. In addition, a corresponding symbol path is retained. Enter +1 or enter −1 for a current symbol based on a transition path, and increase a depth of a corresponding path by 1. After the processing in the foregoing steps, $2^{k-1}$ measure distances and $2^{k-1}$ corresponding symbol paths are further obtained.

Sequentially process the K to N symbols based on the foregoing steps. When a last symbol $y_N$ is processed, the $2^{k-1}$ measure distances d and the corresponding $2^{k-1}$ symbol paths are obtained. In this case, a path depth is N. Sort the $2^{k-1}$ measure distances in ascending order. Find a measure distance with a smallest accumulated distance, and obtain an index corresponding to the measure distance. Based on the index, take a decoded symbol sequence of an index corresponding to the path. The decoded symbol sequence is a final decoding result. Record a decoded sequence as $S_{decoder}$ (i), i=1~N. Compare the decoded sequence $S_{decoder}$(i) with an input sequence $x_i$(K:N), to check whether the decoding result is correct and calculate a bit error rate of the system.

Figure 12:
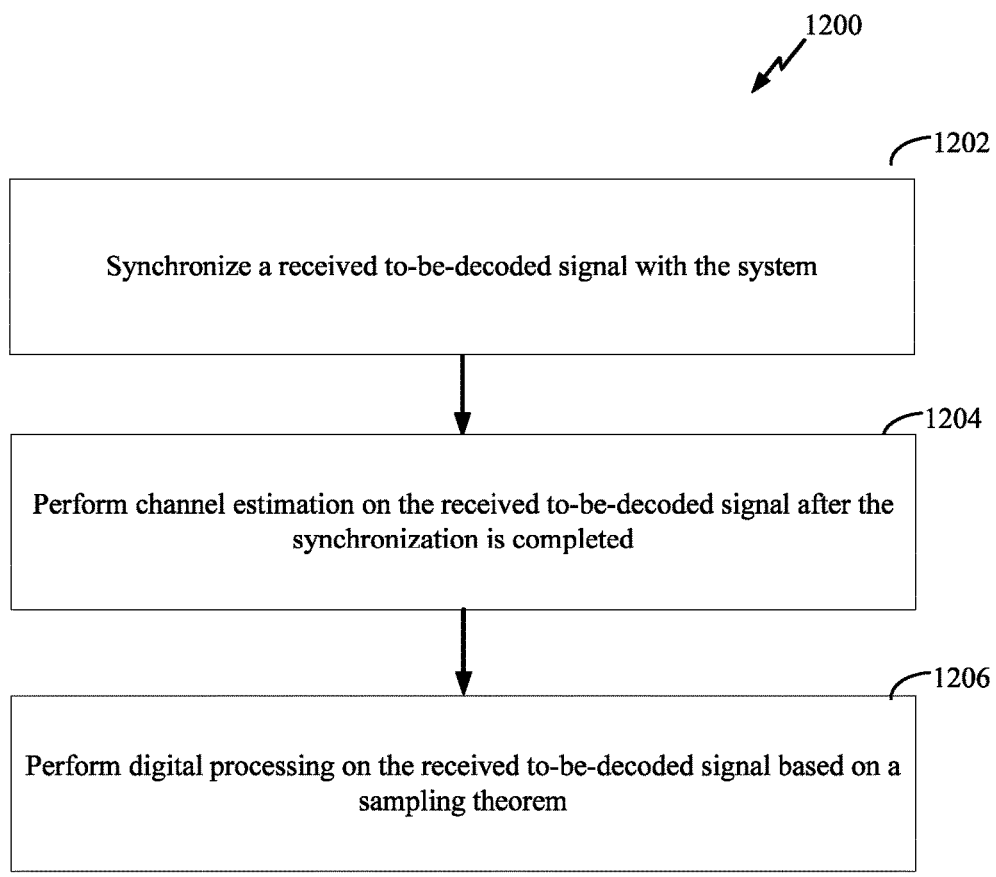
FIG. 12 is a flowchart of a preprocessing procedure before a to-be-decoded signal is decoded in a decoding method applied to a truncated OvTDM system according to an embodiment of the present invention.

Referring to FIG. 12, before a to-be-decoded signal is decoded, a decoding method applied to a truncated OvTDM system according to an embodiment of the present invention may further include a preprocessing procedure 1200. The preprocessing procedure 1200 includes: 1202: Synchronize a received to-be-decoded signal with the truncated OvTDM system, where the synchronization may be timing synchronization or carrier synchronization. 1204: Perform channel estimation on the received to-be-decoded signal after the synchronization is completed, where the channel estimation is used to estimate a parameter of an actual transmission channel. 1206: Perform digital processing on the received to-be-decoded signal based on a sampling theorem, where the digital processing may include cutting a received waveform based on a waveform transmit time interval.

According to the decoding method applied to the truncated OvTDM system in the present invention, a measure distance is used to select a best path. The measure distance represents a distance between two signals. During selection of the best path, a path with a smallest measure distance is selected as the best path. Therefore, a path closest to an ideal signal can be accurately found, thereby improving a decoding success rate of the system.

When measure distances are compared, if only a measure distance between a current symbol and an ideal symbol is compared, a best path may have a deviation as a decoding depth increases, and consequently, a final decoding success rate decreases. K symbols are overlapped with each other in a symbol superimposition procedure, and the symbols are closely associated. Therefore, a best path may be determined by using a current measure distance and a sum of previously accumulated measure distances. In this way, the best path can be determined more accurately as the decoding depth increases, thereby improving the decoding success rate.

For the truncated system, the first K−1 symbols of the system are known, that is, in a communication procedure, a transmit end and a receive end of the first K−1 symbols know each other and reach an agreement, and the first K−1 symbols do not need to be decoded. A decoding sequence starts from a $K^{th}$ symbol, namely, $y_i$(K:N). A total of N−K+1 symbol sequences need to be detected. By using the truncated system, decoding efficiency can be improved, and system design complexity can be reduced.

In a specific embodiment of the present invention, an encoding/decoding procedure is described by using a square wave as a multiplexing waveform. The number of times K of overlapped multiplexing is set to 3. As shown in FIG. 13, an input sequence $x_i$={+1 +1 −1 +1 −1 +1 +1 +1 −1 +1}, and an encoded output sequence is s(t)={+1 +2 +1 +1 −1 +1 +1 +3 +1 +1}. As shown in FIG. 13, the first two symbols of the encoded output are not superimposition results of three signals.

An encoded signal is transmitted through an actual channel. A to-be-decoded symbol sequence received at a receive end has a deviation and is recorded as $y_i$, where i=1~10. A received symbol sequence in this embodiment is $y_i$={−

0.0123, 1.0439, 0.369, 0.6781, −0.5921, 1.0252, 0.2574, 2.0371, 0.8769, 0.9036}. When p in a measure distance $$d = \sqrt[p]{|y_i - x_i|^p}, 0 < p < \infty$$

is 2, the measure distance is correspondingly an Euclidean distance. Decoding steps are described by using the Euclidean distance as an example.

First, generate possible states, namely, ideal symbols $S_{theory}(i)$, obtained after K=3 symbols are superimposed.

When K=3, there are a total of eight states after the symbols are superimposed: $S_{theory}(1)=\tilde{a}_0+\tilde{a}_1+\tilde{a}_2$, $S_{theory}(2)=\tilde{a}_0+\tilde{a}_1-\tilde{a}_2$, $S_{theory}(3)=\tilde{a}_0-\tilde{a}_1+\tilde{a}_2$, $S_{theory}(4)=\tilde{a}_0-\tilde{a}_1-\tilde{a}_2$, $S_{theory}(5)=-\tilde{a}_0+\tilde{a}_1+\tilde{a}_2$, $S_{theory}(6)=-\tilde{a}_0+\tilde{a}_1-\tilde{a}_2$, $S_{theory}(7)=-\tilde{a}_0-\tilde{a}_1+\tilde{a}_2$, and $S_{theory}(8)=-\tilde{a}_0-\tilde{a}_1-\tilde{a}_2$. Correspondingly, there are a total of four output symbol levels: ±3 and ±1.

Calculate Euclidean distances of a current symbol.

Respectively calculate Euclidean distances by using a third symbol $y_3$ and the eight ideal symbols, and record the Euclidean distances as $d_{current}(i)$, i=1~8. An Euclidean distance calculated by using $y_3$ and $S_{theory}(1)$ is recorded as $d_{current}(1)$, an Euclidean distance calculated by using $y_3$ and $S_{theory}(2)$ is recorded as $d_{current}(2)$, and so no, and an Euclidean distance calculated by using $y_3$ and $S_{theory}(8)$ is recorded as $d_{current}(8)$.

Calculate an accumulated Euclidean distance of the current symbol.

The accumulated Euclidean distance is represented as $$D_{m,n} = d_i\left(\frac{n+1}{2}\right) + d_{current}(n), m = K + 1 \sim N, n = 1 \sim 2^K$$
$$i = m - 1.$$

In this embodiment, it is considered by default that all four Euclidean distances $d_2$ of the first two nodes are 1, and all corresponding symbol paths are 0. Then, a $d_2$ value corresponding to a third symbol is the same and is 1. Starting from a fourth symbol, a $d_i$ value changes to $D_{m,n}$, that is, an accumulated Euclidean distance of a previous node, and so on, and a $d_i$ value of a tenth symbol changes to $D_9$.

Select a best path.

It can be learned from $S_{theory}(i)$ that a difference between an upper part and a lower part of $S_{theory}(i)$ lies in that first symbols are different (+1, −1), and permutations and combinations of the following two symbols are correspondingly the same. Based on this phenomenon, it can be distinguished whether a new incoming symbol is +1 or −1.

Compare Euclidean distances $D_{3,1}$ and $D_{3,5}$. It is learned that the Euclidean distance $D_{3,5}$ is smaller. Record the smaller Euclidean distance $D_{3,5}$ and mark it as a new $d_1$. Increase a path depth from 2 to 3, and record a third symbol as +1. A new symbol path sequence (0 0 1) is obtained. Record the symbol path sequence as a new $path_1$.

Compare Euclidean distances $D_{3,2}$ and $D_{3,6}$. It is learned that the Euclidean distance $D_{3,2}$ is smaller. Record the smaller Euclidean distance $D_{3,2}$ and mark it as a new $d_2$. Increase a path depth from 2 to 3, and record a third symbol as −1. A new symbol path sequence (0 0 −1) is obtained. Record the symbol path sequence as a new $path_2$.

Compare Euclidean distances $D_{3,3}$ and $D_{3,7}$. It is learned that the Euclidean distance $D_{3,3}$ is smaller. Record the smaller Euclidean distance $D_{3,3}$ and mark it as a new $d_3$. Increase a path depth from 2 to 3, and record a third symbol as +1. A new symbol path sequence (0 0 1) is obtained. Record the symbol path sequence as a new $path_3$.

Compare Euclidean distances $D_{3,4}$ and $D_{3,8}$. It is learned that the Euclidean distance $D_{3,4}$ is smaller. Record the smaller Euclidean distance $D_{3,4}$ and mark it as a new $d_4$. Increase a path depth from 2 to 3, and record a third symbol as −1. A new symbol path sequence (0 0 −1) is obtained. Record the symbol path sequence as a new $path_4$.

To sum up, the following new possible best paths are obtained: $path_1$: (0 0 1), $path_2$: (0 0 −1), $path_3$: (0 0 1), and $path_4$: (0 0 −1).

Figure 14:
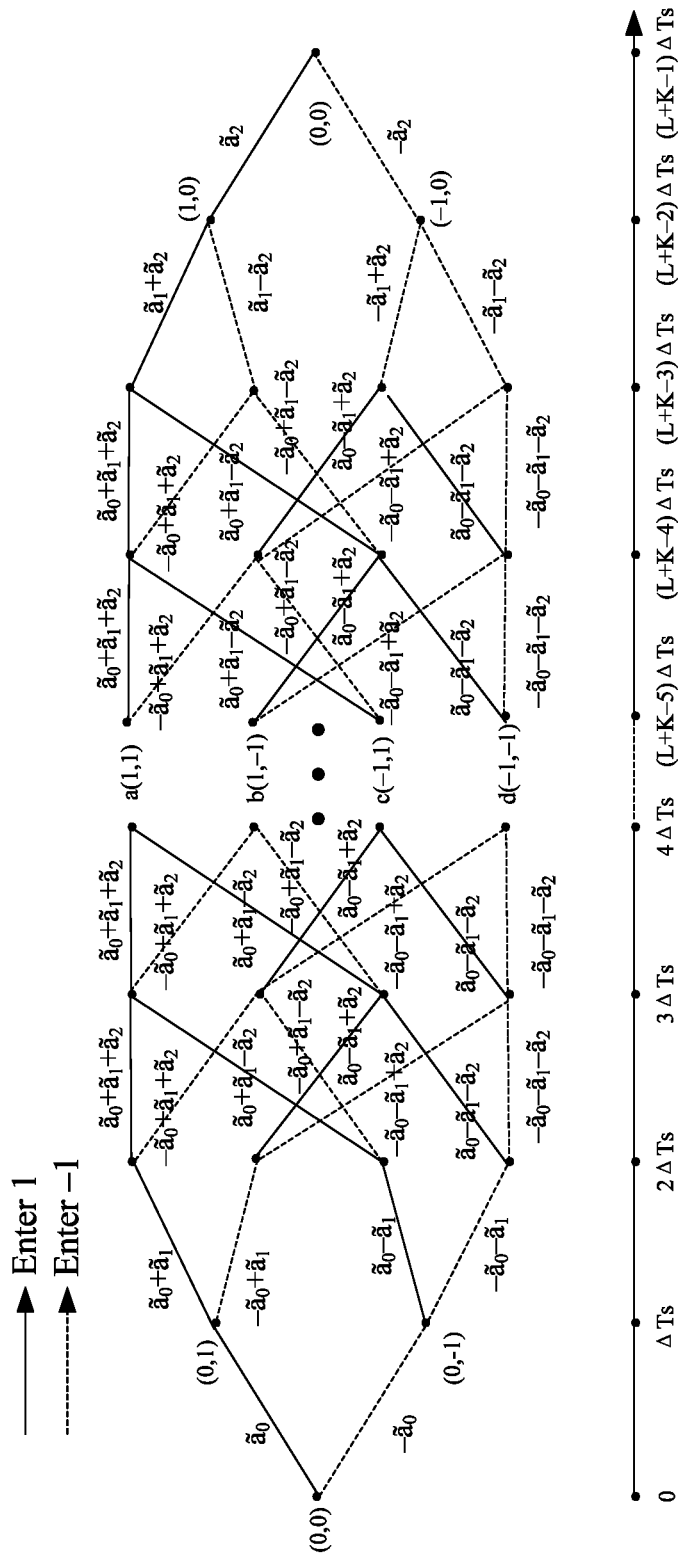
FIG. 14 is a K=3 truncated OvTDM Trellis diagram according to an embodiment of the present invention.
Figure 15:
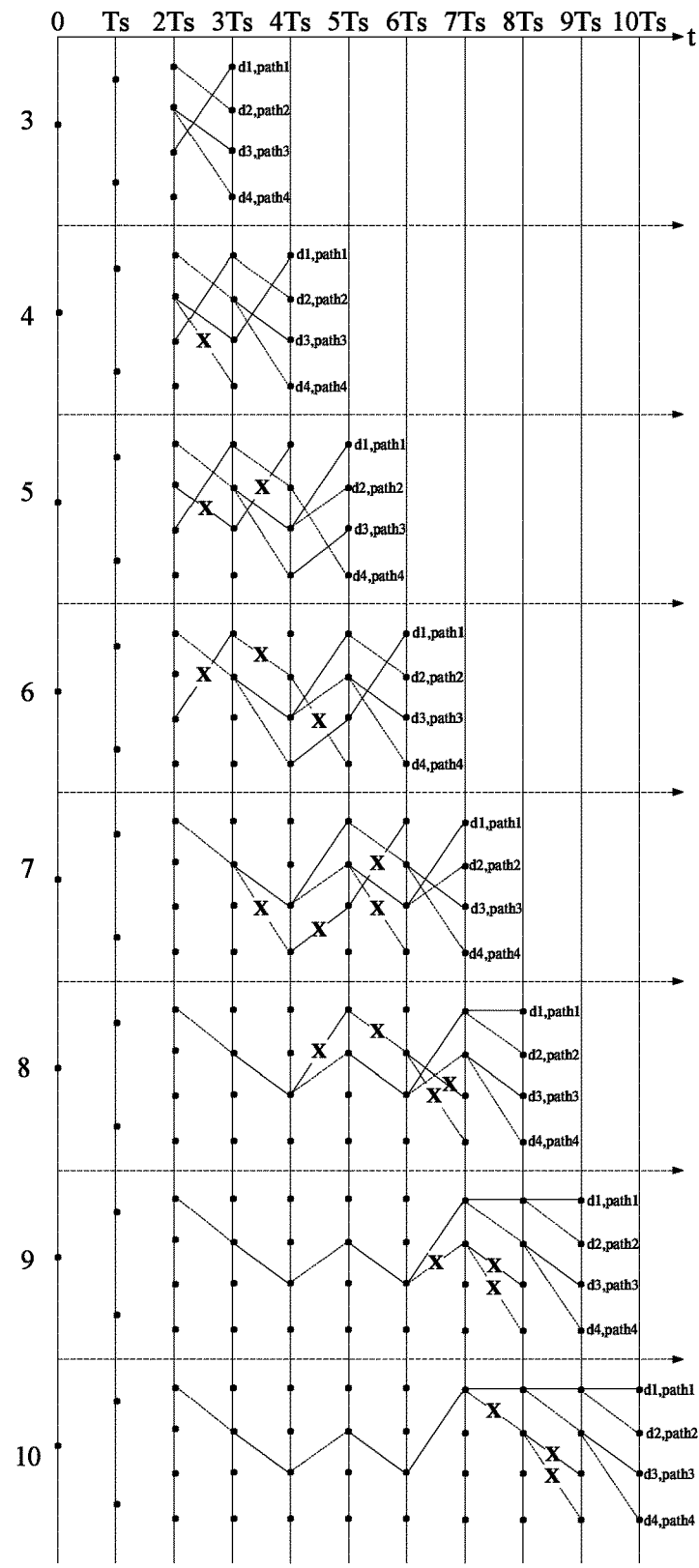
FIG. 15 is a symbol sequence detection path diagram according to an embodiment of the present invention.

Likewise, perform sequence detection on the fifth to tenth symbols based on the foregoing method. Referring to a K=3 OvTDM Trellis diagram in FIG. 14, an obtained symbol detection procedure is shown in FIG. 15. Finally obtained symbol sequences are sequentially:

$path_1$: (0 0 −1 1 −1 1 1 1 1 1), $path_2$: (0 0 −1 1 −1 1 1 1 1 −1), $path_3$: (0 0 −1 1 −1 1 1 1 −1 1), $path_4$: (0 0 −1 1 −1 1 1 1 −1 −1).

By comparing the $path_1$, $path_2$, $path_3$, and $path_4$, it can be found that paths with a same initial node in a path memory are gradually unified as a decoding depth increases. Therefore, paths with a same initial node among paths can be first output in a decoding procedure, to save storage space.

Corresponding Euclidean distances are sequentially $d_1=3.5071$, $d_2=3.0049$, $d_3=2.4493$, and $d_4=3.6040$. By comparing the four distances, it can be learned that the Euclidean distance $d_3$ is the smallest. Correspondingly, the $path_3$ is selected as the output symbol sequence.

That is, it is considered that the output symbol sequence is $S_{decode}(3:10)=(-1\ 1\ -1\ 1\ 1\ 1\ -1\ 1)$, and the input symbol sequence is $x_i=\{+1\ +1\ -1\ +1\ -1\ +1\ +1\ +1\ -1\ +1\}$, where $x(3:10)=\{-1\ +1\ -1\ +1\ +1\ +1\ -1\ +1\}$. By comparing $S_{decode}(3:10)$ and $x(3:10)$, the two sequences are completely the same, indicating that a decoding result is correct.

In the present invention, a decoding apparatus applied to a truncated OvTDM system includes: a unit configured to receive a to-be-decoded symbol sequence, where the to-be-decoded symbol sequence includes N symbols; a unit configured to generate $2^K$ ideal superimposed symbol sequences obtained after K ideal symbol sequences are superimposed; a unit configured to sequentially calculate first distances between a current symbol $y_i$ and each ideal superimposed symbol sequence, where i=K~N; a unit configured to obtain, based on the first distances, second distances obtained after accumulation of the current symbol; a unit configured to: after a last symbol $y_N$ is processed, obtain an ideal symbol sequence corresponding to a minimum accumulated distance based on the second distances; and a unit configured to use the ideal symbol sequence corresponding to the minimum accumulated distance as an output symbol sequence.

The present invention may be further applied to a truncated OvFDM system. Compared with the decoding apparatus in the truncated OvTDM system, a processing apparatus is added at a signal receiving stage in this decoding apparatus, to convert a frequency-domain signal into a time-domain signal. That is, the decoding apparatus applied to the OvFDM system includes: a unit configured to receive a to-be-decoded signal; a unit configured to convert the to-be-decoded signal into a frequency-domain to-be-decoded symbol sequence, where the to-be-decoded symbol sequence includes N symbols; a unit configured to generate $2^K$ ideal superimposed symbol sequences obtained after K ideal symbol sequences are superimposed; a unit configured to sequentially calculate first distances between a current symbol $y_i$ and each ideal superimposed symbol sequence, where i=K~N; a unit configured to obtain, based on the first distances, second distances obtained after accumulation of the current symbol; a unit configured to: after a last symbol $y_N$ is processed, obtain an ideal symbol sequence corresponding to a minimum accumulated distance based on the second distances; and a unit configured to use the ideal symbol sequence corresponding to the minimum accumulated distance as an output symbol sequence.

According to an aspect of the present invention, K is the quantity of times of overlapped multiplexing.

According to an aspect of the present invention, both the first distances and the second distances are measure distances.

The decoding apparatus applied to the truncated OvTDM/OvFDM system according to this embodiment of the present invention further includes a preprocessing unit configured to perform preprocessing on the to-be-decoded symbol sequence. The preprocessing unit includes: a synchronizer, configured to synchronize the received to-be-decoded signal with the system, where the synchronization may be timing synchronization or carrier synchronization; a channel estimator, configured to perform channel estimation on the received to-be-decoded signal after the synchronization is completed, where the channel estimation is used to estimate a parameter of an actual transmission channel; and a digital processor, configured to perform digital processing on the received to-be-decoded signal based on a sampling theorem.

According to the decoding apparatus applied to the truncated OvTDM/OvFDM system in the present invention, a measure distance is used to select a best path. The measure distance represents a distance between two signals. During selection of the best path, a path with a smallest measure distance is selected as the best path. Therefore, a path closest to an ideal signal can be accurately found, thereby improving a decoding success rate of the system.

When measure distances are compared, if only a measure distance between a current symbol and an ideal symbol is compared, a best path may have a deviation as a decoding depth increases, and consequently, a final decoding success rate decreases. K symbols are overlapped with each other in a symbol superimposition procedure, and the symbols are closely associated. Therefore, a best path may be determined by using a current measure distance and a sum of previously accumulated measure distances. In this way, the best path can be determined more accurately as the decoding depth increases, thereby improving the decoding success rate.

For the truncated system, the first K−1 symbols of the system are known, that is, in a communication procedure, a transmit end and a receive end of the first K−1 symbols know each other and reach an agreement, and the first K−1 symbols do not need to be decoded. A decoding sequence starts from a $K^{th}$ symbol, namely, $y_i$(K:N) A total of N−K+1 symbol sequences need to be detected. By using the truncated system, decoding efficiency can be improved, and system design complexity can be reduced.

It can be learned from the foregoing embodiments that a difference between the truncated and non-truncated manners mainly lies in: In the non-truncated manner, the to-be-decoded symbol sequence is divided into the first symbol sequence (1:K) and the second symbol sequence (K+1:N), and then the first distances between the first symbol sequence (1:K) and each of the corresponding $2^K$ ideal superimposed symbol sequences are calculated.

However, in the truncated manner, the first distances between the $K^{th}$ to the $N^{th}$ symbol and each ideal superimposed symbol sequence are calculated, and then the second distances obtained after accumulation of the current symbol are obtained based on the first distances.

It can be learned that, based on the truncated manner, a division point of symbols 1 to N changes from K to K+1, and then the first distances between the symbol sequence 1 to K and each of the corresponding $2^K$ ideal superimposed symbol sequences are calculated, and the truncated manner changes to the non-truncated manner.

Generally, a length of to-be-decoded data is relatively large, and an accumulated distance increases as a decoding depth increases. If a system performs decoding output after all data is decoded, system resource consumption is relatively large. Therefore, a better processing method is used for a path storage capacity and distance storage. Usually, a path storage length of 4K-5K is selected. In this case, if a path memory is full but decoding decision output has not been performed, decision output may be performed forcibly, and the output is first performed for initial nodes having a same path. The accumulated distance increases as the decoding depth increases. In this case, the accumulated distance may be stored as a relative distance. In other words, a reference distance is defined, and a value of the reference distance varies depending on a system. In distance storage, a relative value of a second distance of each path relative to the reference distance is recorded. During selection of a best path, comparison is performed based on the relative distance.

Although the present invention is described with reference to the current specific embodiments, a person of ordinary skill in the art should be aware that the foregoing embodiments are merely used to describe the present invention, and various equivalent modifications or replacements may be made without departing from the spirit of the present invention. Therefore, modifications and variations made to the foregoing embodiments within the essential spirit and scope of the present invention shall fall within the scope of the claims of this application.

What is claimed is:

1. A decoding method, performed by a decoding apparatus comprising a hardware processor and a memory, the method comprising:
    receiving, by the decoding apparatus, a to-be-decoded symbol sequence, wherein the to-be-decoded symbol sequence comprises N symbols;
    dividing, by the decoding apparatus, the received to-be-decoded symbol sequence into a first symbol sequence (1:K) and a second symbol sequence (K+1:N), wherein K is less than N;
    calculating, by the decoding apparatus, first distances between the first symbol sequence (1:K) and each of corresponding $2^K$ ideal superimposed symbol sequences, and obtaining, by the decoding apparatus, paths corresponding to $2^{k-1}$ relatively small distances based on the first distances;
    sequentially performing sequence detection, by the decoding apparatus, on each symbol in the second symbol sequence (K+1:N) based on the paths corresponding to the $2^{k-1}$ relatively small distances, calculating, by the decoding apparatus, second distances between each symbol in the second symbol sequence and each of the corresponding $2^K$ ideal symbol sequences, and after the sequence detection is performed on a last symbol, obtaining, by the decoding apparatus, an ideal symbol sequence corresponding to a minimum distance based on the second distances; and using, by the decoding apparatus, the ideal symbol sequence corresponding to the minimum distance as an output symbol sequence.

2. The decoding method according to claim 1, wherein when the decoding method is applied to an Overlapped Frequency Division Multiplexing, OvFDM, system, the step of receiving, by the decoding apparatus, a to-be-decoded symbol sequence further comprises:
receiving a to-be-decoded signal, and converting the to-be-decoded signal into a frequency-domain to-be-decoded symbol sequence.

3. The decoding method according to claim 1, wherein both the first distances and the second distances are measure distances.

4. The decoding method according to claim 1, wherein the calculating, by the decoding apparatus, first distances between the first symbol sequence (1:K) and each of corresponding $2^K$ ideal superimposed symbol sequences comprises:
generating, based on a quantity K of symbols comprised in the first symbol sequence, all $2^K$ possible transmit symbol sequences corresponding to the K symbols;
dividing all the possible transmit symbol sequences into a first part and a second part based on a first symbol in all the $2^K$ possible transmit symbol sequences, wherein each part comprises $2^{k-1}$ possible transmit symbol sequences;
sequentially accumulating each group of symbols in all the possible transmit symbol sequences level by level, to obtain K ideal superimposed symbol sequences;
calculating a distance between a symbol in the first symbol sequence and each ideal superimposed symbol sequence, to obtain $2^K$ paths; and
comparing distances of two corresponding possible transmit symbol sequences that are respectively in the first part and the second part and that are different only in a first symbol, to obtain $2^{k-1}$ relatively small distances and use the $2^{k-1}$ relatively small distances as the first distances.

5. The decoding method according to claim 1, wherein the calculating, by the decoding apparatus, second distances between each symbol and each of the corresponding $2^K$ ideal symbol sequences comprises:
generating the $2^K$ ideal symbol sequences obtained after K symbols are superimposed;
determining a state of a previous node of a current symbol;
obtaining a state transition path based on the state of the previous node; and
obtaining $2^{k-1}$ relatively small distances between the current symbol and ideal symbols based on the state transition path, and using the $2^{k-1}$ relatively small distances as the second distances.

6. The decoding method according to claim 1, wherein the second distances are distances obtained after accumulation of the current symbol.

7. A decoding apparatus, comprising a hardware processor, configured to execute program modules stored in a memory, wherein the program modules comprise:
a unit configured to receive a to-be-decoded symbol sequence, where the to-be-decoded symbol sequence comprises N symbols;
a unit configured to divide the received to-be-decoded symbol sequence into a first symbol sequence (1:K) and a second symbol sequence (K+1:N), wherein K is less than N;
a unit configured to calculate first distances between the first symbol sequence (1:K) and each of corresponding $2^K$ ideal superimposed symbol sequences, and obtain paths corresponding to $2^{k-1}$ relatively small distances based on the first distances;
a unit configured to sequentially perform sequence detection on each symbol in the second symbol sequence (K+1:N) based on the paths corresponding to the $2^{k-1}$ relatively small distances, calculate second distances between each symbol in the second symbol sequence and each of the corresponding $2^K$ ideal symbol sequences, and after the sequence detection is performed on a last symbol, obtain an ideal symbol sequence corresponding to a minimum distance based on the second distances; and
a unit configured to use the ideal symbol sequence corresponding to the minimum distance as an output symbol sequence.

8. The decoding apparatus according to claim 7, wherein when the decoding apparatus is applied to an Overlapped Frequency Division Multiplexing, OvFDM system, the program modules further comprise:
a unit configured to convert a to-be-decoded signal into a frequency-domain to-be-decoded symbol sequence.

9. The decoding apparatus according to claim 7, wherein both the first distances and the second distances are measure distances.

10. A decoding method, performed by a decoding apparatus comprising a hardware processor and a memory, the method comprising: receiving, by the decoding apparatus, a to-be-decoded symbol sequence, wherein the to-be-decoded symbol sequence comprises N symbols;
generating, by the decoding apparatus, $2^K$ ideal superimposed symbol sequences obtained after K ideal symbol sequences are superimposed, wherein K is less than N;
sequentially calculating, by the decoding apparatus, first distances between a current symbol $y_i$, and each ideal superimposed symbol sequence, wherein i is from K to N, i is an integer;
obtaining, by the decoding apparatus, based on the first distances, second distances obtained after accumulation of the current symbol;
after a last symbol $y_N$ is processed, obtaining, by the decoding apparatus, an ideal symbol sequence corresponding to a minimum accumulated distance based on the second distances; and
using, by the decoding apparatus, the ideal symbol sequence corresponding to the minimum accumulated distance as an output symbol sequence.

11. The decoding method according to claim 10, wherein when the decoding method is applied to an Overlapped Frequency Division Multiplexing, OvFDM system, the step of receiving, by the decoding apparatus, a to-be-decoded symbol sequence further comprises:
receiving a to-be-decoded signal, and converting the to-be-decoded signal into a frequency-domain to-be-decoded symbol sequence.

12. The decoding method according to claim 10, wherein K is the number of times of overlapped multiplexing.

13. The decoding method according to claim 10, wherein both the first distances and the second distances are measure distances.

14. The decoding method according to claim 10, wherein the obtaining, by the decoding apparatus, based on the first distances, second distances obtained after accumulation of the current symbol comprises:

obtaining an accumulated distance of a previous node of the current symbol; and using, as the second distances, sums of the first distances between the current symbol and ideal symbols and the accumulated distance of the previous node of the current symbol.

15. A decoding apparatus, comprising a hardware processor, configured to execute program modules stored in a memory, wherein the program modules comprise:
   a unit configured to receive a to-be-decoded symbol sequence, wherein the to-be-decoded symbol sequence comprises N symbols;
   a unit configured to generate $2^K$ ideal superimposed symbol sequences obtained after K ideal symbol sequences are superimposed, wherein K is less than N;
   a unit configured to sequentially calculate first distances between a current symbol $y_i$, and each ideal superimposed symbol sequence, wherein i is from K to N, i is an integer;
   a unit configured to obtain, based on the first distances, second distances obtained after accumulation of the current symbol;
   a unit configured to: after a last symbol $y_N$ is processed, obtain an ideal symbol sequence corresponding to a minimum accumulated distance based on the second distances; and
   a unit configured to use the ideal symbol sequence corresponding to the minimum accumulated distance as an output symbol sequence.

16. The decoding apparatus according to claim 15, wherein when the decoding apparatus is applied to an Overlapped Frequency Division Multiplexing, OvFDM system, the program modules further comprises:
   a unit configured to convert a to-be-decoded signal into a frequency-domain to-be-decoded symbol sequence.

17. The decoding apparatus according to claim 15, wherein K is the number of times of overlapped multiplexing.

18. The decoding apparatus according to claim 15, wherein both the first distances and the second distances are measure distances.

* * * * *